United States Patent
Bell

(10) Patent No.: US 10,110,976 B2
(45) Date of Patent: Oct. 23, 2018

(54) SYSTEMS AND METHODS FOR SYSTEM MEASUREMENTS INTEGRITY DETERMINATION

(71) Applicant: Utilidata, Inc., Providence, RI (US)

(72) Inventor: David Gordon Bell, Spokane, WA (US)

(73) Assignee: UTILIDATA, INC., Providence, RI (US)

( * ) Notice: Subject to any disclaimer, the term of this patent is extended or adjusted under 35 U.S.C. 154(b) by 0 days.

(21) Appl. No.: 15/728,415

(22) Filed: Oct. 9, 2017

(65) Prior Publication Data

US 2018/0103302 A1 Apr. 12, 2018

Related U.S. Application Data

(60) Provisional application No. 62/406,163, filed on Oct. 10, 2016.

(51) Int. Cl.
| | |
|---|---|
| *H04Q 9/00* | (2006.01) |
| *G06N 99/00* | (2010.01) |
| *H02J 3/00* | (2006.01) |
| *G01D 4/00* | (2006.01) |
| *H02J 13/00* | (2006.01) |

(52) U.S. Cl.
CPC ............ *H04Q 9/00* (2013.01); *G06N 99/005* (2013.01); *G01D 4/002* (2013.01); *G01D 4/004* (2013.01); *H02J 13/0006* (2013.01); *H02J 2003/003* (2013.01); *H04Q 2209/60* (2013.01); *H04Q 2209/823* (2013.01)

(58) Field of Classification Search
CPC ................ H04Q 9/00; H04Q 2209/60; H04Q 2209/823; G06N 99/005; H02J 2003/003; H02J 13/0006; G01D 4/002; G01D 4/004
See application file for complete search history.

(56) References Cited

U.S. PATENT DOCUMENTS

| | | | |
|---|---|---|---|
| 6,154,036 A | 11/2000 | Baldwin | |
| 6,735,535 B1 | 5/2004 | Kagan et al. | |
| 8,095,326 B2 * | 1/2012 | Berggren | ............. G01R 31/088 702/58 |
| 8,736,460 B2 * | 5/2014 | Brennan, Jr. | ............ H04Q 9/00 340/870.02 |
| 9,163,963 B2 * | 10/2015 | Bell | ..................... G01D 18/002 |

(Continued)

FOREIGN PATENT DOCUMENTS

WO WO-2016/130482 8/2016

OTHER PUBLICATIONS

International Search Report for PCT Appl. Ser. No. PCT/US2017/055794 dated Jan. 18, 2018 (17 pgs.).

(Continued)

*Primary Examiner* — Mohamed Barakat
(74) *Attorney, Agent, or Firm* — Christopher J. McKenna; Foley & Lardner LLP

(57) ABSTRACT

Systems and methods of the present disclosure are directed to determining the integrity of system measurements. The system and methods of the present disclosure can detect corrupted process measurement signals that can originate in instrumentation used with electricity distribution and transmission systems. These process measurement signals may be delivered by digital communications networks.

22 Claims, 9 Drawing Sheets

(56) References Cited

U.S. PATENT DOCUMENTS

| | | | |
|---|---|---|---|
| 9,426,036 B1* | 8/2016 | Roy | H04L 41/145 |
| 9,432,430 B1 | 8/2016 | Klenz | |
| 2002/0105233 A1 | 8/2002 | Vice | |
| 2008/0049013 A1 | 2/2008 | Nasle | |
| 2009/0017763 A1* | 1/2009 | Dong | H04B 1/1027 |
| | | | 455/65 |
| 2011/0082596 A1 | 4/2011 | Meagher et al. | |
| 2012/0036250 A1 | 2/2012 | Vaswani et al. | |
| 2012/0271576 A1 | 10/2012 | Kamel et al. | |
| 2013/0197955 A1* | 8/2013 | Dillon | H04W 40/246 |
| | | | 705/7.13 |
| 2013/0242445 A1 | 9/2013 | Dani et al. | |
| 2013/0271289 A1 | 10/2013 | Hampapur et al. | |
| 2014/0122022 A1 | 5/2014 | Chen et al. | |
| 2014/0258254 A1 | 9/2014 | Suleiman et al. | |
| 2015/0100856 A1* | 4/2015 | Zhang | H04L 1/0041 |
| | | | 714/776 |
| 2016/0366170 A1 | 12/2016 | Bell | |
| 2017/0034027 A1* | 2/2017 | Thompson | G01S 5/0278 |
| 2017/0093160 A1 | 3/2017 | Bell | |

OTHER PUBLICATIONS

Bandt et al, "Permutation entropy: a natural complexity measure for time series", Institute of Mathematics and Institute of Physics, 2002.

Dickey et al, Distribution of the Estimators for Autoregressive Time Series with a Unit Root, Journal of American Statistical Association, vol. 74, No. 366, p. 247-431, (1979).

Eng et al, Algorithms for Downsampling Non-Uniformly Sampled Data, 15th European Signal Processing Conference, (2007).

Li et al, An Introduction to Kolmogorov Complexity and Its Applications, 3rd Ed., Springer Verlag 2008, ISBN 9870387498201.

Massey et al, Conservation of Mutual and Directed Information, Proc. ISIT, Sep. 4-9, 2005, ISSN 2157-8095.

Pal et al, Estimation of Renyi Entropy and mutual information based on generalized nearest-neighbor graphs, Proc. 23rd Int. Conf. Neural Information Processing Systems,(2010).

Parzen, E, Estimation of a Probability Density Function and Model, The Annals of Mathematical Statistics,vol. 33, No. 3, pp. 1065-1076, (1962).

U.S. Office Action on U.S. Appl. No. 15/728,346 dated Dec. 11, 2017.

U.S. Office Action on U.S. Appl. No. 15/728,420 dated Dec. 19, 2017.

Vitanyi, Paul, "Information Distance in Multiples", IEEE Trans. Information Theory, 57, No. 4, pp. 2451-2456, (2011).

Wiener, Norbert, The theory of Prediction, Modern mathematics for the engineer, pp. 125-139, McGraw-Hill, 1956.

* cited by examiner

SYSTEMS AND METHODS FOR SYSTEM MEASUREMENTS INTEGRITY DETERMINATION

CROSS-REFERENCES TO RELATED APPLICATIONS

This application claims the benefit of priority under 35 U.S.C. § 119 to Provisional Patent Application No. 62/406,163, filed Oct. 10, 2016, which is hereby incorporated by reference herein in its entirety.

FIELD OF THE DISCLOSURE

This disclosure relates generally to systems and methods for determining the integrity of system measurements. In particular, the present disclosure describes techniques for detecting corrupted process measurement signals that can originate in instrumentation used with electricity distribution and transmission systems, and which are then delivered by digital communications networks.

BACKGROUND

A utility grid can include an interconnected network for delivering a utility (e.g., electricity, power, energy, water, gas, natural gas, oil, phone, Internet, or communications bandwidth) from a supplier of the utility to a consumer of the utility. Utility grids may include or interact, interface or communicate with one or more devices or assets that facilitate generating the utility, controlling an aspect of the utility grid, delivering the utility from one point to another point in the utility grid, managing the utility grid, monitoring the utility grid, or tracking the consumption of the utility. These devices can include digital computation devices, systems, processors, or other circuitry configured to facilitate an aspect of the utility grid.

Instrumentation used to detect characteristics of electricity may be operationally corrupted, generate corrupted process measurement signals, or otherwise detect and report corrupted process measurement signals. These corrupted signals can then be delivered via digital communication networks. In some cases, instruments or devices that transmit the signals can corrupt the signals during transmission over the digital communication network. For example, a digital asset in an electrical grid may operate in an abnormal manner causing disturbances to energy delivery conditions in the electric grid. These disturbances may result in service interruptions or may even damage an asset or device of the electrical grid. However, it may be challenging to detect corrupted signals or measurements in a utility grid, thus making it challenging to determine the cause of disturbances in the utility grid or properly respond to the measurement.

BRIEF SUMMARY

Systems and methods of the present disclosure are directed to determining the integrity of system measurements. Systems measurements can include or refer to process measurement signals. The system and methods of the present disclosure can detect corrupted process measurement signals that can originate in instrumentation used with electricity distribution and transmission systems. These process measurement signals may be delivered by digital communications networks.

For example, utility distribution systems can be controlled or managed by a fully or partially automated system, or by human operators. To properly control or manage the utility distribution system, the automated system or human operator may use measurements of numerous electrical quantities and information related to the operational status of equipment used with the utility distribution system. These electrical quantities and information may be known to be correct within a given accuracy in accordance with a specification or configuration of the device making the measurement. The electrical quantities and information can be conveyed via a digital communications network system to various other systems, such as components of utility distribution systems, smart grid devices, instruments, or communications appliances. The electrical quantities and information can be conveyed in a digitized form.

However, since the devices comprising the digital communications networks tasked with transport of the electrical quantities and information may be vulnerable to intrusions that can compromise the integrity of the messages and content carried by such networks, the delivery and integrity of these measurements may be corrupted. Further, control decisions that are transmitted via the digital communications network to distribution system devices can also be corrupted, which can result in an unintended change to the operating state of the distribution system.

Systems and methods of the present solution can detect measurement signals related to electrical quantities that are corrupt, forged, or otherwise spurious and inconsistent with the relevant properties of the processes that generate the measurement signals. Systems and methods of the present solution can analyze the measurement signals using techniques for solitary time series with no dependency assumptions, techniques for paired processes with some dependency, and also techniques for ensembles of N time series (where N is at least 2) in which each member series is physically expected to be at least co-dependent (e.g., including a degree of causal dependence) with another member series. Systems and methods of the present solution can analyze the measurement signals using an information transfer matrix, the elements of which are information metrics calculated with pairs of grouped signals to identify deviations from expected behaviors and relationships in the energy consumption stochastic processes.

BRIEF DESCRIPTION OF THE FIGURES

The details of one or more embodiments of the subject matter described in this specification are set forth in the accompanying drawings and the description below. Other features, aspects, and advantages of the subject matter will become apparent from the description, the drawings, and the claims.

Like reference numbers and designations in the various drawings indicate like elements.

DETAILED DESCRIPTION

Figure 1:
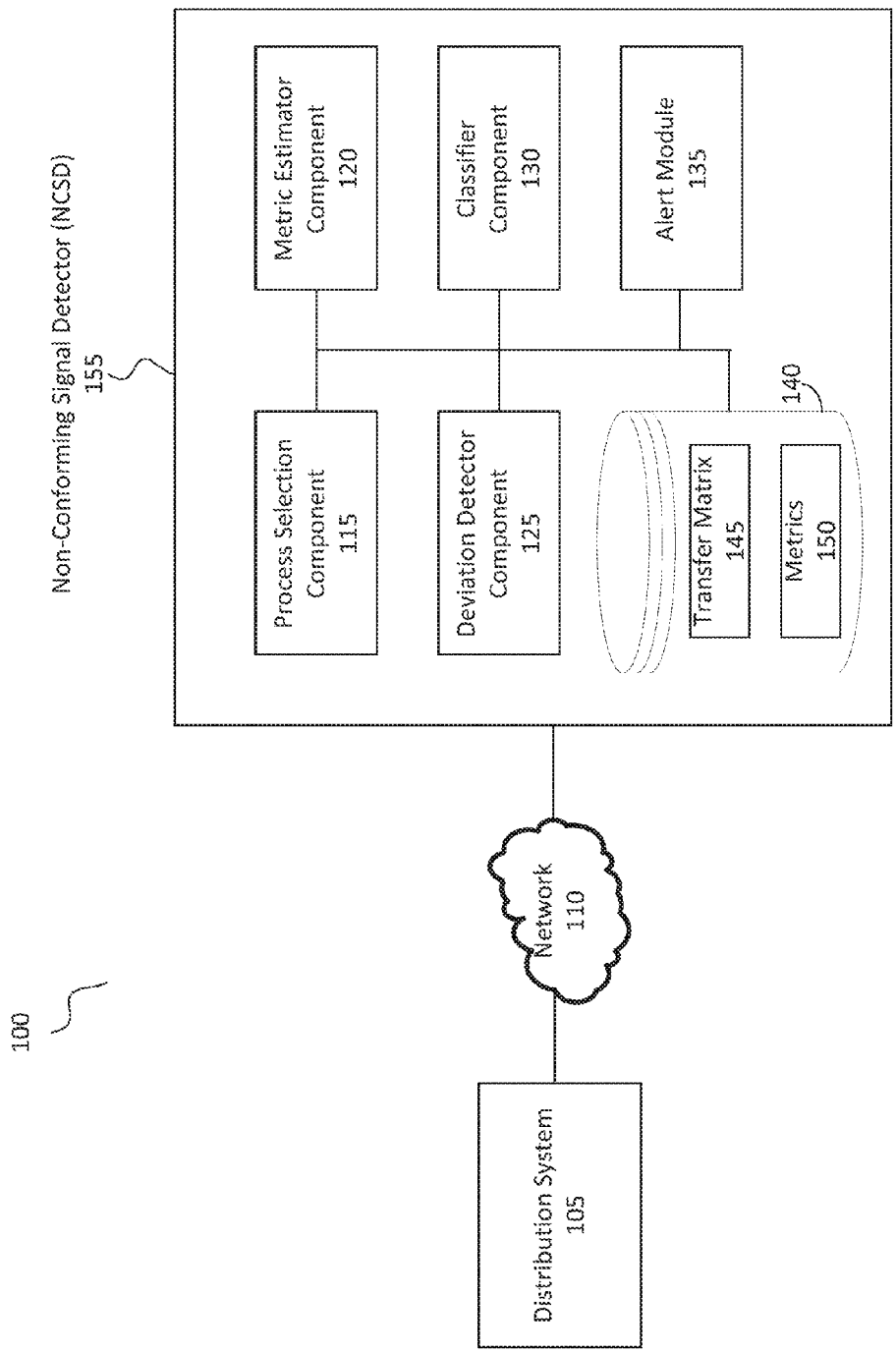
FIG. 1 is a bock diagram depicting a system for detecting non-conforming signals, in accordance with an embodiment.

Systems and methods of the present disclosure are directed to determining the integrity of system measurements. Systems measurements can include or refer to process measurement signals. The system and methods of the present disclosure can detect corrupted process measurement signals that can originate in instrumentation used with electricity distribution and transmission systems. These process measurement signals may be delivered by digital communications networks.

For example, utility distribution systems can be controlled or managed by a supervisory system, which can be fully or partially automated, or operated by human operators. To properly control or manage the utility distribution system, the automated or human operated supervisory system can use measurements of numerous electrical quantities and information related to the operational status of equipment used with the utility distribution system. These electrical quantities and related information can include or be referred to as system measurements or process measurement signals. The supervisory system can acquire and process measurement signals and related information from numerous and diverse sources associated with a distribution system. For example, processes measurement signals can include electrical quantities and related information such as:

- electrical measurements from distribution system instrumentation and control assets, including, e.g., voltage ("V"), current ("I"), power ("P"), reactive power ("Q"), apparent power ("S"), or harmonics;
- ambient condition measurements reported by distribution system instrumentation or ancillary instruments communicating with the supervisory system, including, e.g., temperature, humidity, or wind velocity;
- measurements originating in photovoltaic systems, including, e.g., the characterization of the electrical output of such systems and including solar irradiance (e.g., power per unit area received from the Sun in the form of electromagnetic radiation in the wavelength range of the measuring instrument), total solar irradiance (e.g., solar power over all wavelengths per unit area), or solar insolation (e.g., the amount of solar energy received per square centimeter per minute).

These electrical quantities and related information may be known to be correct within a given accuracy in accordance with a specification or configuration of the device making the measurement. The electrical quantities and information can be conveyed via a digital communications network system to various other systems, such as components of utility distribution systems, smart grid devices, instruments, or communications appliances. The electrical quantities and information can be conveyed in a digitized form.

However, since the digital communications networks tasked with transport of the electrical quantities and information may be vulnerable to intrusions that can compromise the integrity of the messages and content carried by such networks, the delivery and integrity of these measurements may be corrupted. Further, control decisions that are transmitted via the digital communications network to distribution system devices can also be corrupted, which can result in an unintended change to the operating state of the distribution system.

Systems and methods of the present solution can detect measurement signals related to electrical quantities that are corrupt, forged, or otherwise spurious and inconsistent with the relevant properties of the processes that generate the measurement signals. Systems and methods of the present solution can analyze the measurement signals using technique for solitary time series with no dependency assumption, paired processes with some dependency, or an ensemble series. For example, the present solution can generate and analyze an information transfer matrix with pairs of grouped signals to identify deviations from expected behaviors and relationships in the energy consumption stochastic processes.

Various types of instrumentation systems can be used to observe processes or measure electrical quantities associated with the utility grids. For example, a metering device can be used to measure electrical quantities in an electric distribution system. At least some of the processes or electrical quantities observed or measured by the instrumentation system can have a random component. A signal that measures a characteristic of a process can manifest a degree of randomness and be characterized as a stochastic process. For example, a population of consumers' demand for energy delivered by an electricity distribution systems can be characterized as stochastic processes. However, other processes or electrical quantities can be related. For example, as a consequence of structural connectivity of such distribution systems, interaction amongst demand processes can influence the electrical measurement signals observed in the distribution system.

In some cases, the random component of such signals may not be essential to understanding the behavior of the process under observation. In these cases, the random component may be treated as noise, which can refer to a signal component bearing no relevant information or a signal component that is otherwise undesirable. However, in other cases, such as those processes either known to be stochastic or known to possess salient stochastic properties, the apparently random components of the measurement signals can provide insights to the process behavior. Thus, the random components of the measurement signals can be informative with respect to the stochastic process under observation. The systems and methods of the present solution are configured to analyze these signals to determine information about the stochastic process. For example, the present solution can use analytical methods and metrics applicable to stochastic processes to demonstrate that salient characteristics of stochastic processes can be quantified such that deviant behavior of such processes, or deviant behavior of the measurement signals observed on such processes, can be systematically detected. Further, since such processes can be encountered in engineering systems in configurations and connections that lead to interactions between the individual stochastic processes, systems and method of the present disclosure can be configured with analytical techniques that facilitate quantification of such interactions, such that operational decisions motivated by detected deviations from expected interactions are so informed.

In delivery or distribution systems, such as electric energy delivery systems, system measurement signals can be realizations of dependent stochastic processes. Even though electric energy customers consumption behaviors tend to be repetitive in the sense that their energy consumption depends on periodic repetitive activities, the measurement signals can be stochastic because their consumption has a random temporal component: the times at which a particular energy consuming device is activated and de-activated by an individual customer are random, such that the process of energy consumption is random. Further, assuming that the members of the population of consumption processes are mutually independent, the consumption by an individual customer may not depend in any way on consumption by any other customer.

While the measurement signals exhibit a degree a randomness indicative or a stochastic process, the measurement signals also indicate a level of dependency, thereby indicating the presence of dependent stochastic processes. For example, electric energy delivery systems include interconnected circuits that can include overhead and underground conductors, transformers that establish circuit nominal voltages corresponding to conveyance distances and expected power delivery (e.g., nominal voltages such as 115 kV to 500 kV or higher in alternative current ("AC") transmission lines, up to 1000 kV in DC transmission lines, 69 kV or 34.5 kV in high capacity distribution systems, or 24 kV, 14.4 kV, 13.8 kV, 12.47 kV or lower in other distribution systems based on the capacity of the distribution system), capacitors and static VAR compensators for management of reactive 'power' in the circuits, and switches of various configurations depending on purpose, environment, and voltage and power levels. Further, the consumption devices utilized by customers are also circuit components that affect currents in parts of the interconnected circuits.

Systems and methods of the present disclosure are configured with techniques to estimate or determine measurement signals in the interconnected circuits and in the geographic areas served by these circuits. The techniques can include characterizing the stochastic measurement signals by means of parameters supported by stochastic process theory to identify process behaviors and interdependencies. Systems and methods of the present disclosure can use techniques based on solitary time series with no dependency assumptions, techniques for paired processes, and also techniques for ensembles of N time series (where N is at least 2) in which each member series is physically expected to be at least co-dependent (e.g., including a degree of causal dependence) with another member series. In both the techniques based on solitary time series with no dependency assumption and techniques for ensembles of N time series with co-dependency, the following metrics can be generated or determined:

non-parametric metrics, including moments, correlations, nearest neighbor classification, all applicable to N time series involving, for example, cross-correlations;

probability metrics, including any parameter derived from a density estimate, in turn obtained by simple binning, or by a kernel estimator, or by Bayesian inference on the basis of an assumed theoretical density;

information metrics, including for example, entropic measures, the Gibbs measure, and mutual entropy measures (eg Kullback-Leibler divergence), or differential entropy measures such as the Fisher Information; or causality metrics, applicable only for N≥2, including for example the Granger Causality or any form of Transfer Entropy.

In some cases, such as for industrial customers or manufacturing processes, electric energy demand processes may be stationary. A stationary process refers to a stochastic process whose joint probability distribution does not change when shifted in time. For example, in a stationary process, parameters such as mean and variance do not change over time. However, in many cases, the statistical measures of electric energy demand processes encountered in distribution and transmission systems vary over time and, therefore, are time-variant or not stationary. For example, the output characteristics of the system can depend on time. Thus, systems and methods of the present disclosure can account for the time varying nature of the probability structure of the demand process and their consequent distribution system measurements to estimate some or all of these metrics.

To identify deviations from expected behaviors and relationships in the energy consumption stochastic process, systems and methods of the present disclosure can identify and quantify properties of the dependent stochastic processes. For example, the system can include or use devices or instruments configured to observe stochastic time series in the electric distribution and transmission circuits, determine that such time series are at least inter-dependent, and perhaps as a consequence of connectivity and the electrical behavior of the circuit physical components, also conditionally causal with physically anticipated directionality, and use one or more techniques to determine and quantify the relevant properties to identify a deviation from expected behaviors and relationships in the energy consumption stochastic processes.

The systems and methods of the present disclosure can use the identified deviation from the expected behaviors and relationships in the energy consumption stochastic processes to detect a non-conforming signal indicative of signal forging, corruption or other sampling failures. The system can establish, account for, use or assume various characteristics of the stochastic time series when detecting the non-conforming signal. For example, the system can assume that demand processes include or are formed of independent stochastic processes. Since the demand process signals are not stationary, the system can use one or more techniques for processing non-stationary signals. In some cases, the system can simplify computation by assuming the demand processes are stationary. The system can observe the demand processes, and characteristics or signals thereof, through the effects of the demand processes on the distribution system. However, due to circuit coupling and interactions on the distribution system, the observations of the demand processes made using distribution system signals may not be independent. Thus, the system can detect the non-conforming signals by identifying deviations using both independent process metrics and dependent process metrics.

To detect or identify the non-conforming signals, the system can select a process or type of process to analyze. For example, the system can select a solitary process, paired process, or an ensemble of processes. For a solitary process, the system can select a time series to analyze. For paired processes, the system can select a time series for the pair of processes based on dependency between the processes. For the ensemble of processes, the system can analyze each pair of processes in the ensemble of processes using a time series for the selected pair of processes. For example, the dependency between the processes can be based on physical factors such as circuit coupling, connectivity, or other interactions in the distribution system.

The system can select a metric with which to analyze a single signal or a pair of signals. The metric can refer to a characteristic of the process, or a type of measurement. The metric can refer to a property of the process. The system can then select an estimator configured to quantify the metric. The estimator can include an estimation technique that can determine a value for the selected metric for the selected signal or pair of signals. The system can identify which estimator to apply to the one or more processes. The system can identify a relevant estimator to apply based on a physical relevance of the estimator. For example, the system can select the estimator to apply based on characteristics associated with the processes. The system can then apply the estimator to the selected one or more processes to determine or estimate the metric for the process or pair of processes.

Upon identifying one or more relevant estimators to apply to the one or more processes to quantify the metric, the system can identify a qualifier for the estimator for the metric to establish a characterization of the process (e.g., signal). The system can use the qualifier to establish or learn the nominal metric or nominal bounds for the metric for a nominal demand cycle. The system can use the characterization of the nominal process to estimate the properties and parameters of the relevant metrics.

For example, the system can estimate the properties and parameters of the relevant metrics by first obtaining one or more sampled time series for one or more processes, and preparing and qualifying the selected sample time series for the selected process. The system can prepare and qualify the selected time series by computing any derived time series. A derived time series can refer to manipulating the time series data by, for example, smoothing the data, filtering samples, or filling in void samples. The system can further determine that the time series meets certain preprocessing or qualification criteria, such as a total number of voids, values for samples within an expected range, or size of the data set.

The system can then estimate solitary time series metrics for each of the selected time series. The system can estimate dependency and causality metrics for paired process analysis. If the system is in the initial learning or training mode, the system can update metrics parameter estimates using a qualification technique to establish nominal metric or nominal bounds.

For each of the metrics and corresponding estimators identified as being relevant based on physical factors of the selected processes, the system can estimate the magnitude of deviation from nominal behavior identified based on the qualifier that corresponds to the estimator of the metric. The system can estimate the confidence in the relevant hypotheses for deviation and conformance, with respect to each estimator. The system can estimate the magnitude of deviation from nominal behavior for both solitary and dependency properties.

The system can identify any detected deviations and combine the reports generated using one or more estimators to assert a determination of the integrity of the measurements of the selected process. The system can determine the deviant behavior of solitary time series or of dependencies between multiple time series using multiple estimators. The system can report estimated metrics for each of the selected estimators, report deviations of the metrics from nominal metrics, report measures of significance of such deviations, and report a measure of confidence in the hypothesis that reported deviation(s) may be judged to be nominal. The system can identify the non-conforming signal based on a lack of integrity or high level of deviation, and report the non-conforming signal.

Referring now to FIG. 1, a bock diagram depicting a system for detecting non-conforming signals in accordance with an embodiment is shown. The system 100 can include a non-conforming signal detector ("NCSD") 155. The NCSD 155 can interact with, be integrated with, interface with, or otherwise communicate with a distribution system 105, which can, for example, include or refer to a utility grid or electricity distribution grid. The NCSD 155 can include one or more components to detect non-conforming signals. In brief overview, the NCSD 155 can include a process selection component 115 designed and constructed to select a type of process analysis, such as a solitary process analysis or a paired process analysis, as well as a time series of the process analyze. The NCSD 155 can include a metric estimator component 120 designed and constructed to estimate parameters or properties of one or more metrics. The NCSD 155 can include a deviation detector component 125 designed and constructed to estimate a magnitude of deviation of from a nominal behavior. The NCSD 155 can include a classifier component 130 designed and constructed to classify the deviation. The NCSD 155 can include an alert module 135 designed and constructed to generate an alert or a report based on the deviation or the classification of the deviation. The NCSD 155 can include or access a database, memory, data repository, or data storage device 140. The data storage device 140 can include or store a transfer matrix 145 or other data to facilitate detector non-conforming signals of utility grid or distribution system 105.

The process selection component 115, metric estimator component 120, deviation detector component 125, classifier component 130, or alert module 135 can each include at least one processing unit or other logic device such as programmable logic array engine, or module configured to communicate with the database 140. The process selection component 115, metric estimator component 120, deviation detector component 125, classifier component 130, or alert module 135 or database 140 can be separate components, a single component, or part of the NCSD 155. The process selection component 115, metric estimator component 120, deviation detector component 125, classifier component 130, or alert module 135 can be configured on, constructed with, or execute on one or more component or module of system 200 depicted in FIGS. 5A-5B. The process selection component 115, metric estimator component 120, deviation detector component 125, classifier component 130, or alert module 135 can interact with, interface with, or otherwise communicate with one or more component or module of distribution system 105 depicted in FIG. 2.

Still referring to FIG. 1, and in further detail, the NCSD 155 can include a process selection component 115. The process selection component 115 can select a type of process analysis and further select a type of process to analyze using the selected process analysis. The NCSD 155 can observe the processes of interest via instrumentation systems, such as metering devices 218 depicted in FIG. 2. These observed processes can manifest some degree of randomness in their characteristic measurement signals. In some cases, the random component of such signals may can be treated as noise. In some cases, where the process is stochastic or possess salient stochastic properties, the NCSD 155 can determine or identify a behavior of the process based on the random components of the measurement signals. For example, the random components of the measurement signals can provide information with respect to the stochastic process under observation. The NCSD 155 can analyze these signals to determine information about the stochastic process.

The process selection component 115 can select the type of process analysis. For example, the type of process analysis can include a solitary process analysis, a paired process analysis, or an ensemble process analysis. A solitary process analysis can refer to analyzing data, such as a time series, for a single process, metric, behavior, or characteristic of electricity with no dependency. For example, a first time series for a characteristic of electricity at a first consumer site can be independent from a second time series for a characteristic of electricity at a second consumer site.

A paired process analysis can refer to analyzing two different time series or signals that exhibit or are expected to exhibit some amount of dependence. An ensemble or group process analysis can refer to two or more different time series, processes, metrics, behaviors, or characteristics of electricity that exhibit dependence. The members of the ensembles of N time series (where N is at least 2) can be physically co-dependent with at least one other member time series, including possibly some degree of causal dependence.

The solitary process can be stochastic, non-stationary, and have cyclical demand processes, which can indicate periodic characterization of short-time stationarity. The paired processes can also be stochastic, non-stationary and have cyclical demand, while additionally manifesting physical co-dependence, which can indicate that causality metrics would be relevant characterizations. The grouped processes can additionally indicate ensemble co-dependence, in turn revealing a structure of co-dependence amongst paired processes selected such that the dependence measures may be arranged as a matrix which will be termed the information transfer matrix. The information transfer matrix object can provide a systematic representation of co-dependence amongst the grouped processes, in which the processes are examined pair-wise to form the elements of the matrix.

The NCSD 155 can select processes or signals based on physical criteria, logic, rules, or heuristic techniques. The NCSD 155 can identify signals or processes that are to be paired or analyzed together based on anticipated physical dependence. For example, the NCSD 155 can select two or more signals obtained from two or more metering sites on a same branch of a circuit in the distribution system. In another example, the NCSD 155 can select one metering site ahead of a branch point and one metering site after a branch point. In yet another example, the NCSD 155 can select signals from metering devices that are at a common phase. If a first signal or process in the distribution system is expected or anticipated to depend on a second signal or process in the distribution system, then the NCSD 155 can group or pair them together for further analysis. In the event that one of the first signal or the second signal is a forged signal, the pair of signals may not maintain their measurable dependence. Thus, the NCSD 155 can identify a forged signal, or that at least one of the paired signals is forged, based on the pair of signals not maintaining their expected or anticipated dependency by detecting that the measure of dependency of the pair of signals deviates from the nominal measure of dependency.

Electric energy delivery systems can be represented as or exhibit characteristics of an interconnected circuit that includes both overhead and underground conductors or transformers for establishing circuit nominal voltages suited to conveyance distances and expected power delivery, capacitors and static VAR compensators for management of reactive 'power' in the circuits, and switches of various configurations depending on purpose, environment, and voltage and power levels. Further, devices used by customers that consume the supplied electricity are circuit components in this context, each responsible for currents in some parts of the interconnected circuits. Due to the interconnected nature of the distribution grid 105, a first time series for a characteristic of electricity at a first consumer site can have a level of dependence or influence upon a second time series for a characteristic of electricity at a distribution point.

Thus, the NCSD 155 can select signals and group them for further processing in various configurations of the distribution system including, for example, long rural circuits with multiple metering sites associated with control elements, networked circuits with multiple sources of power supply, or sites selected from multiple circuits having a common source (e.g. voltage regulating transformer, load tap changer, or on-load tap changer). By grouping signals and analyzing them as an ensemble of two or more, the NCSD 155 can form elements of an information transfer matrix.

In some implementations, the NCSD 155 can select the group or ensemble of signals based on connectivity of the respective measurement sites in the electric distribution circuit. The level of connectivity can indicate interdependence or causality. Each such signal can then be assigned an index that becomes the row and column index in a matrix whose elements are some metric, described below, such that the diagonal of this matrix comprises either: null values for those metrics having no sensible interpretation when both signal sources for a paired metric are the same signal; or the metric of a signal computed with both signals in a pair are the same signal. The NCSD 155 can generate, update, or create this matrix such that the off-diagonal elements comprise information theoretic metrics estimating dependence or causality, which can be referred to as the information transfer matrix.

For example, the matrix can include a group comprising N signals selected according to some physical, process, or connectivity criteria. These N signals can be indexed 1 . . . N. The NCSD 155 can then compute a metric $h_{ik}$ computed from signals i and k where $1 \leq i \leq N$ and $1 \leq k \leq N$, is the element at row i and column k of the information transfer matrix H based on the metric of interest. The metric elements h may be any metric suitable for paired signals, such that the same metric is used for all signal pairings in a given matrix H. Table 1 illustrates an example information transfer matrix generated by the NCSD 155 for four signals.

TABLE 1

Illustrative information transfer matrix for four signals.

| | k | | | |
|---|---|---|---|---|
| i | 1 | 2 | 3 | 4 |
| 1 | $h_{11}$ | $h_{12}$ | $h_{13}$ | $h_{14}$ |
| 2 | $h_{21}$ | $h_{22}$ | $h_{23}$ | $h_{24}$ |
| 3 | $h_{31}$ | $h_{32}$ | $h_{33}$ | $h_{34}$ |
| 4 | $h_{41}$ | $h_{42}$ | $h_{43}$ | $h_{44}$ |

In the example information transfer matrix illustrated in Table 1, the NCSD 155 generates metrics for each pair of signals from the group of signals. The group of signals can have four signals. The NCSD 155 pairs each signal in the group of signals with another signals. The NCSD 155 can select a metric to analyze for each pair of signals. The metric can capture a physical measure of the pair of signals, such as a variation over time. The NCSD 155 can then select an estimator technique to use to determine a value for the metric or otherwise quantify the metric. Upon quantifying the selected metric using the selected estimator, the NCSD 155 can use a qualifier to determine the significance or importance of the quantity. The qualifier can indicate a level of confidence in the estimate of the metric. The NCSD 155 can use the qualifier technique to determine a nominal quantity for the metric, or identify nominal bounds for the metric. The information transfer matrix can be stored in a transfer matrix data structure 145 in data repository 140.

In the example information transfer matrix illustrated in Table 1, the group or ensemble of signals can include four signals as follows: 1, 2, 3 and 4. The NCSD 155 can select a metric, and an estimation technique to quantify the metric. The NCSD 155 can then apply the selected estimation technique to a pair of signals to generate a value or quantity for the selected metric. For example, the estimated metrics for the pair of signals 1 and 2 can be $h_{12}$, as illustrated in Table 1. The diagonal of the matrix illustrated in Table 1 can include either: null values for those metrics having no sensible interpretation when both signal sources for a paired metric are the same signal; or the metric of a signal computed with both signals in a pair are the same.

The NCSD 155 can include a metric estimator component 120 to estimate or determine metrics for the selected processes. The metric estimator component 120 can apply an estimator to establish the characterization of the process by estimating the properties and parameters of the relevant metrics. The metric estimator component 120 can establish the characterization of the nominal process. The metric estimator component 120 can establish the characterization of additional processes, which the NCSD 155 can compare with the nominal process to determine a deviation from the nominal process. Since electric energy demand processes encountered in distribution and transmission systems may not be stationary in some cases, the metric estimator component 120 can account for the time varying nature of the probability structure of the demand processes and their consequent distribution system measurements in order to estimate the metrics.

The metric estimator component 120 can access a metrics data structure 150 to select a type of metric to use to analyze a signal, a pair of signals, or each of a pair of signals in an ensemble of signals. The metric estimator component 120 can access the metrics data structure 150 to select a corresponding estimation technique with which to quantify the selected metric. The metric estimator component 120 can access the metrics data structure 150 to select a qualifier used to determine a significance of the estimated value of the metric (e.g., whether the estimated value of the metric is nominal or within nominal bounds, or deviates from a nominal value or a nominal bound). The qualifier can be learned based on using historical sample time series known to be good or nominal sample time series (e.g., lacking deviations or forged or corrupted signals). The following Table 2 illustrates an example metrics data structure used by the metric estimator component 120 to select a type of metric, a corresponding estimator, and a corresponding qualifier (e.g., to generate or learn the nominal metric or nominal matrix metric). The metrics data structure 150 can map metrics to estimators to qualifier.

TABLE 2

Illustrative example of types of metrics, estimation techniques and qualifiers.

| | Metric | Estimator | Qualifier |
|---|---|---|---|
| 1) Statistics | Univariate central moments; autocorrelation sequence, power spectra | hypothesis test (e.g., differences in central moments; variations in the location of correlation & spectral peaks); robust outlier content | confidence measures |
| 2) Density approximations | non-parametric density, parametric densities (alpha-stable densities that represent heavy tails) | classical naive estimator; nearest neighbor density estimation (kNN); kernel density estimation | for parametric case: test quality of parameter using maximum likelihood method; nonparametric case use Bayesian inference. |
| 3) Complexity estimation by classical entropy | classical entropy, interpreted as likelihood drawn from possible states | signal entropy, sample entropy, multi-scale expansion of sample entropy, Renyi entropy, Kolmogorov complexity | deviation of a characteristic (e.g., peaks, valleys, regions of sustained increase or decrease, or insignificant variation, bounds) from a learned pattern of an entropic measure over a nominal demand cycle |
| 4) Complexity estimation by permutation entropy | Empirical permutation entropy | time series ordinal pattern estimator | deviation from learned pattern of a permutation entropic measure over a nominal demand cycle |
| 5) Statistical cross-moments | correlation, orthogonality | covariance, cumulants, dot product | correlation, orthogonality |
| 6) joint density and comparative statistics | statistical distance | probability distances (e.g., Minkowski distance, Manhattan distance, Euclidean distance, Chebyshev distance), inner product (e.g., dot product), chi-square; sample distances (e.g., Hausdorff distance, Mahalanobis distance) | deviation from learned pattern of distances over a nominal demand cycle |

TABLE 2-continued

Illustrative example of types of metrics, estimation techniques and qualifiers.

| | Metric | Estimator | Qualifier |
| --- | --- | --- | --- |
| 7) dependency quantification by entropic divergence measures | divergent entropy (e.g., a type of distance measure or a measure of shared information) | Kullback-Leibler Divergence, Conditional entropy | deviation from learned pattern of mutual or gained information |
| 8) causality quantification and prediction by directed dependence measures | causal relationship between two sampled time series, direction exchange of information as a transfer of entropy or as a causality metric | transfer entropy, Wiener-Granger causality, Kramer causally conditioned directed information | deviation from learned pattern of directed/transferred information |

The metric estimator component 120 can use different types of metrics to analyze different types of processes. For example, the metric estimator component 120 can use metric types 1-4 illustrated in Table 2 to analyze solitary processes (e.g., a single signal), and the metric estimator component 120 can use metric types 5-8 to analyze a pair of signals or each of a pair of signals in a group of signals.

For each of the solitary processes and the paired processes, the NCSD 155 can determine or estimate one or more of the following metrics:

non-parametric metrics, including moments, correlations, nearest neighbor classification, all applicable to N time series involving, for example, cross-correlations;

probability metrics, including any parameter derived from a density estimate, in turn obtained by simple binning, or by a kernel estimator, or by Bayesian inference on the basis of an assumed theoretical density;

information metrics, including for example, entropic measures, the Gibbs measure, and mutual entropy measures (eg Kullback-Leibler divergence), or differential entropy measures such as the Fisher Information; or causality metrics, applicable only for $N \geq 2$, including for example the Granger Causality or any form of Transfer Entropy.

To estimate parameters or metrics for the processes, the NCSD 155 can identify one or more time-series for the selected processes. The NCSD 155 can prepare and qualify the selected time series. For example, the NCSD 155 can determine or compute a derived time series. The NCSD 155 can prepare the time series by performing binning, filtering, weighting, or smoothing the time series data. The NCSD 155 can further determine whether the time series qualifies for further processing. For example, the NCSD 155 can evaluate the time series data for any errors, faults, missing data, void data, or otherwise erroneous data values (e.g., null values or formatting errors).

In some implementations, the NCDS 155 can prepare and qualify the time series signals that are to be uniformly sampled. To do so, the NCSD 155 can identify and correct voids in the time series using one or more techniques. A void sample can refer to a sample that does not satisfy a quality criterion, such as a timestamp of the sample, a time at which the sample is received, a value of the sample, the absence of a sample with a timestamp corresponding to an expected time based on the sample rate, or the absence of receiving a sample at an expected time. For example, for a voided sample at interval k, the NCSD 155 can insert an estimate for the voided sample. The estimate for the voided sample can be the mean of the prior n samples, where n is determined by a test for stationarity of the time series over candidate intervals. The estimate for the void can be determined using the Inverse Fourier Transform that is one step ahead in the defective time series from which the Approximate Fourier Transform was calculated. The estimate for the void can be determined using the one step ahead prediction of an autoregressive model of the prior n samples in the time series, such as the Wiener Filter or Levinson's algorithm.

The NCSD 155 can apply pre-processing to the time series data to enhance the metric estimation techniques. For example, the NCSD 155 can apply pre-processing techniques including linear trend removal; identification and removal of spectral components with periods longer than the sample record under consideration; spectral filtering, including (but not limited to) low-pass filtering prior to estimating statistical location, or high-pass filtering prior to estimating statistical scale.

The NCSD 155 can further prepare and qualify the time series by applying limits on the tolerable void sample content of time series such that excess void content disqualifies a time series record from further analysis. For example, the NCSD 155 can correct sampling voids in the sampled time series of the signal prior to determining the metric for the sampled time series of the signal. In some cases, the NCSD 155 can determine to void the sampled time series of the signal based on a number of void samples. For example, if the NCSD 155 determines that the number of void samples exceeds a predetermined threshold, such as an absolute number of voided samples or a percentage of voided samples relative to a total number of samples in a predetermined time interval, then the NCSD 155 can void the sampled time series because further processing the sampled time series can result in erroneous or inaccurate results.

In some embodiments, the NCSD 155 can process, prior to determining the metric for the sampled time series of the signal, the sampled time series of the signal by performing at least one of: linear trend removal, removal of spectral components with periods greater than a sample record, or spectral filtering.

The NCSD 155 can use the prepared and qualified time series to then estimate solitary time series metrics for each of the selected time series. The NCSD 155 can, in addition to, or instead of, estimate dependency and causality metrics for paired process analysis. Determining to process the qualified time series (e.g., a sampled time series of a signal of a process or an operational characteristic of electricity in the utility grid) as a solitary process can refer to determining to analyze the sampled time series of the signal independently from other sampled time series of other signals measured in the utility grid.

For the solitary differential stochastic time series, the NCSD 155 can use one or more statistical techniques to estimate metrics. The metrics determined using statistical techniques are based on idealizing assumptions about the generating processes. These metrics are configured for utility distribution grids, or portions thereof, serving a consumer population with similar demand characteristics (both in terms of appliance connectivity and utilization behaviors), such that the resulting observed random signals exhibit central limit tendencies. Thus, these statistical techniques are directed to generating metrics for a single sampled time series obtained from a single spatial point of observation (e.g., metering device 218*a*).

For example, for the solitary time series, the NCSD 155 can determine metrics such as univariate central moments, which can be computed from the samples of the time series, autocorrelation sequence, or power spectra. The NCSD 155 can determine or estimate these metrics using hypothesis tests or robust outlier content. The NCSD 155 can qualify these metrics or the estimates of these metrics using confidence measures.

The NCSD 155 can determine the metric using univariate central moments, which can be computing from the sampled time series of the signal. The univariate central moments can include scalar quantities, such as mean and variance. The univariate central moments can be determined as the moments (e.g., the first three moments) for samples $x_k$, $x \in X$, $1 \leq k \leq n$ of random process X as illustrated in the following example equations:

$$m_1 = \frac{1}{n}\sum_{k=1}^{n} x_k$$

$$m_2 = \frac{1}{n}\sum_{k=1}^{n} x_k^2 - m_1^2$$

$$m_3 = \frac{1}{n}\sum_{k=1}^{n} x_k^3 - 3m_1\frac{1}{n}\sum_{k=1}^{n} x_k^2 + 2m_1^3$$

The NCSD 155 can use the example equations to determine the univariate central moments as the first three moments $m_1$, $m_2$ and $m_3$. The NCSD 155 can determine or detect deviations of this metric by comparing central moments. For example, the NCSD 155 can compare the central moments of a current sample time series with a nominal metric including a central moment.

The NCSD 155 can determine the metric using an autocorrelation sequence. The NCSD 155 can determine a bi-directional shift along the extent of the sampled time series of the signal. The NCSD 155 can determine the metric as the autocorrelation sequence of the samples $x_k$, $x \in X$, $1 \leq k \leq n$ of the random process X, with no prior knowledge of the density p(x) of X, and assuming that X is wide sense stationary over the interval represented by the samples $x_k$ as illustrated in the following equation:

$$R(\Delta k) = \frac{1}{(n - \Delta k)m_2}\sum_{k=1}^{n-\Delta k}(x_k - m_1)(x_{k+\Delta k} - m_1)$$

The NCSD 155 can detect deviations of this metric based on identifying variations in the location of the correlation as compared to nominal location of a correlation.

The NCSD 155 can determine the metric using a power spectra. The NCSD 155 can determine the power spectra using a discrete Fourier transform or an analog Fourier transform. The power spectra can indicate a portion of the power of the signal (energy per unit time) falling within given frequency bins. The NCSD 155 can detect a deviation of this metric based on variations in the power spectral peaks as compared to a nominal power spectral peak.

The NCSD 155 can estimate or determine density approximations, which can refer to a characterization of 'heavy' tails. To determine density approximations, the NCSD 155 can determine metrics such as non-parametric density or parametric density. The NCSD 155 can include density information indicated by physical assumption on the consumption process. The consumption behavior can manifest as electronic devices at consumer sites turn on and off. Since the rate of on and off occurrences can be driven by social factors and environmental factors, these occurrences may not be stationary. Because these are not stationary processes, the NCSD 155 can model the parametric densities using non-homogeneous Poisson process. As the non-stationary process may not converge to Gaussian approximation even in large numbers, the NCSD 155 can apply densities configured for asymmetry and heavy tails.

The NCSD 155 can include alpha-stable densities for analytical representation of heavy tails, such as a Cauchy alpha-stable density. The NCSD 155 can be configured with techniques having parametric flexibility to accommodates asymmetry and tail weight. For example, alpha-stable densities can provide analytical representations of heavy tails. The alpha-stable densities can be referred to as a generalization of the Gaussian. The sub-Gaussian process can be applicable to characterization of stochastic processes observed in grid electrical measurements. The NCSD 1515 can use the following the density function of alpha-stable random processes:

$$p(x; \alpha, \beta) = \frac{1}{\pi}\int_0^{\infty} \exp(-t^\alpha)\cos[xt + \beta t^\alpha \omega(t, \alpha)]dt$$

where $$\omega(t, \alpha) = \begin{cases} \tan\frac{\alpha\pi}{2} & \text{for } \alpha \neq 1 \\ \frac{2}{\pi}\log|t| & \text{for } \alpha = 1 \end{cases}$$

For special cases where alpha is less than 2 (e.g, Cauchy for alpha=1, Pearson for alpha=½), moments of order 2 and higher do not exist. Therefore, the NCSD 155 can measure the densities for such cases using dispersion, rather than variance. The metrics the NCSD 155 can analyze for processes having these probability properties can be fractional lower-order moments.

The NCSD 155 can use the following estimators to determine metrics associated with density approximations: classical naïve estimator; nearest neighbor; Bayesian inference on assumed densities; kernel density estimation; or $L_2$ risk function for parametric densities. The NCSD 155 can qualify these metrics or the estimates of these metrics using confidence measures or other types of qualifiers.

The classical naïve estimator, or the "naïve density" estimate can be viewed as a systematic method for constructing a histogram from sample data. For example, there can be n values of the random variable X, $X_1$ $X_2$ ... $X_n$ in the sample record. If intervals of width $2h$ are constructed to cover the range of interest, then the estimated density $p(x)$ may be expressed as:

$$p(x) = \frac{1}{2hn} Z_h(x)$$

In this equation for the estimated density, $Z_h(x)$ are the numbers of samples in the interval $[(x-h), (x+h)]$. The NCSD 155 can use the following example decision function to assign a sample to an interval:

$$d(\xi) = \begin{cases} \frac{1}{2} & \text{for } |\xi| < 1 \\ 0 & \text{for } |\xi| \geq 1 \end{cases}$$

With this, the NCSD 155 can express the naïve density with the following equation:

$$p(x) = \frac{1}{nh} \sum_{k=1}^{n} d\left(\frac{x - X_k}{h}\right)$$

The nearest neighbor density estimator ("kNN") can be an extension of the naïve density that treats the sample data as examples of classes that depend on one or more independent influences. Thus, the kNN can modify the naïve density to quantitatively consider distances between sample points, constrained by the selection of the number k of 'nearest neighbors'.

The Kernel density estimator can be similar to the naïve estimator, augmented by implementing a kernel function at each interval of the independent variable.

To qualify whether deviations of parametric measures and estimators are present, the NCSD 155 can test the quality of the parameter estimates using a maximum likelihood technique. The NCSD 155 can compare the sample statistics with those predicted by the estimated parametric density, as a test for the presence of bias. The procedure can involve (i) learning density parameters using known good samples, then (ii) identifying an ordinary level of bias in parameter estimates as obtained from the known good samples, then successively (iii) testing for increased bias on new sample data acquired in real time, indicating that the prior learned density no longer represents the subject stochastic process.

For non-parametric cases, the NCSD 155 can qualify whether deviations of nonparametric measures and estimators are present using the Bayesian inference. For example, Bayes rule can reduce to comparing the number of "neighbor" samples determined to be within the bounds of a class in the conditional density against the unconditional density.

The NCSD 155 can perform complexity estimation using classical entropy. The NCSD 155 can perform this estimation technique to determine metrics associated with classical entropy, which can be interpreted as a likelihood drawn from possible states. To estimate entropy metrics, the NCSD 155 can use estimators such as signal entropy (e.g., standard log probability definition, from density estimate), sample entropy (e.g., threshold run length), Renyi entropy, Kolmogorov complexity, or Gibbs Measure. The NCSD 155 can qualify these metrics or the estimates of these metrics using confidence measures or other types of qualifiers.

The NCSD 155 can estimate signal entropy based on a time series of length sufficient to permit a parametric density function estimate. The entropy computation can be repeated based on a time interval that is greater than or equal to the sampling period of the signal. The NCSD 155 can use the following formula, in which the units of entropy are determined by the base of the logarithm (e.g., use base 2 for digital systems to represent binary values which are measured in bits; for entropy use nats, which is the natural unit of information or entropy, based on natural logarithms and powers of e). The entropy $H_T(t)$ is evaluated at time t for a probability density estimated from a time series of duration T as follows:

$$H_T(t) = -\Sigma_k p_T(t) \log_2 p_T(t)$$

The NCSD 155 can estimate sample entropy. To do so, the NCSD 155 can learn signal properties. The sample entropy estimates may be sensitive to time series extent and specified similarity parameter. Alternative distance measures may be applied to Sample Entropy estimation, such as lower bound on absolute differences (the Chebyshev distance), bounded Euclidean distance, or sum of absolute distances in each measurement axis (also known as the Manhattan distance).

The NCSD 155 can estimate multi-scale expansion of sample entropy. The NCSD 155 can compute the sample entropy at successively coarser scales. Coarser scale series can be derived by computing averages on non-overlapping windows. The metric of interest is information similarity at differing scales, as revealed by consistency of entropy estimated at different scales. Parameters relevant to sample entropy, such as distance measures, can also apply at multiscale.

The NCSD 155 can estimate Renyi entropy, which can correspond to a parametric generalization of the Shannon entropy. The NCSD 155 can determine the Renyi entropy using a prior estimate of probability density.

The NCSD 155 can determine a Kolmogorov complexity, which represents the information contained in the sampled time series which can be measured as entropy. This information can be realized as formulas or algorithms or patterns, without loss of generality.

The NCSD 155 can detect deviations from learned patterns of one or more of these entropic measures. The NCSD 155 can anticipate that information content (or complexity) or signal time series will vary over the course of a nominal demand cycle (e.g., 24 hours, or any other cycle driven by natural, industrial or other processes). The NCSD 155 can estimate entropic measures over intervals within the cycle for which demand has identifiable characteristics (e.g., peaks, valleys, regions of sustained increase or decrease, or insignificant variation over some period). The NCSD 155 can learn the bounds of the subject entropic measure using known good signal samples. Deviations outside such bounds for a given subinterval in the demand cycle, as observed for signals under test in real time, shall indicate change in the information content of such signals, which the NCSD 155 can detect as a deviation.

The NCSD 155 can perform complexity estimation by permutation entropy. The NCSD 155 can perform this estimation technique to determine metrics associated with empirical permutation entropy. The empirical permutation entropy can be considered as a reduced resolution approximation to the Kolmogorov-Sinai entropy, in which partitioning of the subject time series involves a finite number of symbols.

To estimate this metric, the NCSD 155 can use a time series ordinal pattern estimator. The NCSD 155 can use symbolic representations of aspects of the sampled time series to determine patterns in the signal samples, subject to conformance within bounds. Signal samples may be scaled as integers to some appropriate physical units resolution, for example conductor currents as amperes in whole numbers, or system voltages expressed in basis voltage units such as basis millivolts RMS multiplied by 1000 to yield integers. The NCSD 155 can determine the symbols for the sampled time series based on processing steps in order to isolate the type of information used for the entropic measure. For example, over some interval, the mean of the time series may be removed, resulting in a zero-mean series from which the occurrence of symbols can be used. The NCSD 155 can use one or more techniques for processing and transformation, as the symbol identification may be applied to any time series regardless of origin. Using symbols can reduce the complexity of the computation, thereby reducing computing resource utilization such as processor utilization and memory utilization, as well as latency.

The NCSD 155 can qualify these metrics or the estimates of these metrics using confidence measures or other types of qualifiers. The NCSD 155 can identify deviation from learned pattern of a permutation entropic measure. The NCSD 155 can determine or predict that information content (or complexity) or signal time series will vary over the course of a nominal demand cycle (typ. 24 hours for distribution circuit loads). The NCSD 155 can, therefore, estimate entropic measures over intervals within this cycle for which demand has identifiable characteristics (e.g., peaks, valleys, regions of sustained increase or decrease, or insignificant variation over some period). The NCSD 155 can learn the bounds of an entropic measure using known good signal samples (for any of the estimators cited). The NCSD 155 can detect deviations outside such bounds for a given subinterval in the demand cycle, as observed for signals under test in real time, which can indicate change in the information content of such signals.

The NCSD 155 can determine paired measures or grouped measures of metrics. The NCSD 155 can perform paired or group process analysis by determining metrics for ensembles of N time series (where N is at least 2) in which each member time series is physically co-dependent with at least one other member time series, including possibly some degree of causal dependence. By grouping signals and analyzing them in pairs of signals, the NCSD 155 can form elements of an information transfer matrix. Each analysis applies to a pair of signals selected from the group of signals. The NCSD 155 analyzes each pair of signals formed from the group of signals. The NCSD 155 can analyze multiple pairs in the group (or ensemble) of signals.

The NCSD 155 can use the same or different estimators for analyzing paired processes or an ensemble of processes grouped together. For example, for the paired analysis, the NCSD 155 can determine statistical cross-moments or multivariate moments. The NCSD 155 can determine metrics such as correlation or orthogonality. Correlation operates on the time series samples directly. Correlation depends on the time or sample index shift, thus the origin of the correlation sequence. The NCSD 155 transform the time series to improve the discriminating power of the correlation analysis. For example, the NCSD 155 can remove the mean from each time series, or apply a linear phase filtering to isolate a specific spectral region. The NCSD 155 can determine orthogonality based on an inner product, with or without weighting function, being zero. The orthogonality may not be subject to the time shift.

To determine these statistical cross-moment metrics, the NCSD 155 can use estimators such as covariance or cumulants of second or higher order. The correlation can be estimated as a covariance normalized for magnitude, such that the absolute value of correlation is less than or equal to unity. Correlations for finite length time series may be computed by shifting one time series forward or backward in time (sample index) with respect to the other, thus generating the correlation sequence.

The NCSD 155 can use the Cumulant as an estimator for the covariance. The Cumulant can be a generalization of the covariance for orders greater than 2. The Cumulant can be estimated for the sampled time series of the signal. The Cumulant sequence can be analogous to the correlation sequence, but in higher orders. The interpretation of the spectra of such sequences can be consistent with the order of the sequence. For example, sequences and spectra of order 2 reveal information about the energy content of a signal, while order 3 reveals relationships between these energy components.

The NCSD 155 can use a dot product as an estimator for the statistical cross moment metrics. The dot product can estimate the degree to which the spectral contents of the subject time series are out of phase.

The NCSD 155 can qualify these statistical cross moment metrics or the estimates of these metrics using confidence measures or other types of qualifiers. The NCSD 155 can qualify these metrics using a correlation. The NCSD 155 can correlate readily identifiable features, such as location and magnitude of maxima. The NCSD 155 can analyze the dependence of feature properties on time shift. The NCSD 155 can learn the nominal range of feature properties using known good sample data. The NCSD 155 can detect deviations from these nominal metrics, and generate an alert indicating a forgery or deviation from nominal.

The NCSD 155 can qualify these statistical cross moment metrics or the estimates of these metrics using orthogonality. The NCSD 155 can use a learning process to identify nominal ranges of properties using good sample data. Since there is no physical reason to expect definite phase relationship, which can be quantified using orthogonality measures, with any component of the subject random signals, the NCSD 155 can detect the presence of a definite phase relationship as an indication of a potential forgery or deviation from nominal.

The NCSD 155 can determine joint density approximations for paired processes and ensemble measures. The NCSD 155 can determine a statistical distance metric to estimate the joint density. Statistical distance metric can be construed (i) as distance between probability densities, presuming suitable density estimates exist, or (ii) distance between vectors/matrices of sample data. The statistical distance metric can be interpreted as measures of similarity between sample data sets.

The NCSD 155 can use estimators such as probability distances, conditional probabilities, Mahalanobis distance, LP Norms or Minkowski distances. Measures in this class depend on the difference in magnitudes of the subject probability densities for corresponding ranges of the independent variable(s). Distance measures can correspond to in several broad categories, with categorical membership dependent on the type of measure the NCSD 155 performs. For example, $L_P$ Norms (Minkowski distances), can include: $L_1$ Manhattan distance (non-normalized sum of absolute differences); $L_2$ Euclidean distance(square root of the sum of squared differences); and $L_\infty$ Chebyshev distance (maximum difference of any range). Examples of Inner products (aka vector Dot Product) include: basic vector dot product, harmonic mean (each product term inversely weighted by element sum), and cosine (dot product inversely weighted by product of sum of squares of density elements). Examples of chi-squared probability distances include symmetric $\chi^2$ (sum of squared difference terms inversely weighted by sum of elements for each range) and the Pearson $\chi^2$ (sum of squared difference terms inversely weighted by the range element of one of the subject densities). The NCSD 155 can utilize additional categories of probability distances.

The NCSD 155 can use estimators such as sample distances for the statistical distance metric. Sample distance measures can be determined directly from the sample time series data. The distance measurement can depend on the properties of the space in which the measure is made (e.g., two points on a flat plane vs. a sphere). Examples of sample distance measures include Hausdorff distance, configured for a flat space; and Mahalanobis distance, in which the squared differences between samples are inversely weighted by their covariance matrix.

The NCSD 155 can qualify these metrics or the estimates of these metrics using confidence measures or other types of qualifiers. The NCSD 155 can use the qualifier to detect deviation from learned pattern of distances. The NCSD 155 can identify that distances between (or similarity of) pairs of signal time series will vary over the course of a nominal demand cycle (typ. 24 hours for distribution circuit loads). The NCSD 155 can, therefore, estimate distances over intervals within this cycle for which demand has identifiable characteristics (e.g., peaks, valleys, regions of sustained increase or decrease, or insignificant variation over some period). The NCSD 155 bounds of the subject distance measure may be learned using known good signal samples. The deviations outside such bounds for a given subinterval in the demand cycle, as observed for signals under test in real time, shall indicate change in the similarity of such signals.

The NCSD 155 can quantify dependency by entropic divergence measures for paired processes or grouped processes. Using this technique, the NCSD 155 can determine metrics such as mutual information. Divergent entropy may be construed as either (i) a type of distance measure or (ii) a measure of shared information between the subject time series pair. Shared information can indicate some degree of coupling or dependence, and can be referred to as mutual information. Divergent entropy can be estimated from probability densities.

To estimate this metric, the NCSD 155 can use estimators such as Kullback-Leibler Divergence, conditional entropy or marginal density estimates. Kullback-Leibler Divergence can measure mutual information as the density weighted sum of the log ratio of the subject densities. The greater the mutual information can indicate smaller distance between the densities of the subject time series, in turn indicating greater similarity. The density estimates may be non-vanishing for this technique to indicate a measure of mutual information.

Conditional entropy (marginal density estimates) can measure the information (entropy) to predict one of the subject time series given that the other subject time series is treated as known. The conditional entropy can indicate information gained from the known signal, and can be applied reciprocally to assess mutual dependence. The conditional entropy can be estimated similar to classic Renyi entropy, except that the weighting for each summed term is the joint probability, and the logarithmic term is the conditional probability.

The NCSD 155 can qualify these metrics or the estimates of these metrics using confidence measures or other types of qualifiers to detect deviation from a learned pattern of mutual or gained information. The NCSD 155 can identify that information metrics for the pairs of signal time series may vary over the course of a nominal demand cycle (typ. 24 hours for distribution circuit loads). Therefore, the NCSD 155 can estimate entropies over intervals within this cycle for which demand has identifiable characteristics (e.g., peaks, valleys, regions of sustained increase or decrease, or insignificant variation over some period). The NCSD 155 can learn the bounds of the subject information measure using known good signal samples (for any of the estimators cited). Deviations outside such bounds for a given subinterval in the demand cycle, as observed for signals under test in real time, can be detected by the NCSD 155 to indicate change in the similarity of such signals, thereby indicating a potential forgery.

The NCSD 155 can quantify causality using directed dependence measures. The NCSD 155 can quantify this using causality metrics. The NCSD 155 can identify a causal relationship between two time series by applying estimators to time series pairs bi-directionally. The NCSD 155 can use a directional exchange of information that is measured as a transfer of entropy or as a causality metric.

The NCSD 155 can determine these metrics using estimators such as transfer entropy, Wiener-Granger causality, or Kramer causally conditioned directed information. Transfer Entropy can be based on the Wiener causality theorem, which provides that if the ability to predict future values of a first time series is improved through the use of the history of a second time series, then the first time series is said to be causally related to the second. The NCSD 155 can estimate transfer entropy using dependent probabilities in which the logarithm of a ratio of the dependent to the independent probability densities is summed with weights assigned by the joint density of the subject time series.

Wiener-Granger Causality is applicable to stochastic time series which are transformed to be wide-sense stationary. The stochastic sampled time series can be transformed to be wide-sense stationary by removing their means and normalizing their variances over some interval of interest. The sampled time series can then represented by auto-regressive models, and the model residuals can be estimated. The NCSD 155 can determine the causality measure as the log of the ratio of these residuals.

Kramer causally conditioned directed information can refer to the difference between the entropy of a second time series and the entropy of the dependent probability of the second time series upon the first time series. The Kramer causally conditioned directed information can be calculated using a suitable estimator for the required probabilities. The Kramer causally conditioned directed information can measure the flow of information from the first time series to the second.

The NCSD 155 can qualify these metrics or the estimates of these metrics using confidence measures or other types of qualifiers. The NCSD 155 can detect deviation from learned pattern of directed or transferred information. The NCSD 155 can identify that information metrics for the pairs of signal time series may vary over the course of a nominal demand cycle (typ. 24 hours for distribution circuit loads). Thus, the NCSD 115 can estimate entropies over intervals within this cycle for which demand has identifiable characteristics (e.g., peaks, valleys, regions of sustained increase or decrease, or insignificant variation over some period). The NCSD 155 can learn the bounds of the subject information transfer measure using known good signal samples. The NCSD 155 can detect a change in the information transfer between such signals based on deviations outside such bounds for a given subinterval in the demand cycle, as observed for signals under test in real time.

The NCSD 155 can articulate or express estimators using a parameter, such that each metric for that estimator depends on the chosen value of a parameter. For metrics that depend on the chosen parameter for the estimator, the NCSD 155 can generate a matrix H in three dimensions such that H={$h_{ikr}$}, where r is an index associated with a parameter of the present estimator.

The matrices H can have elements computed from selected signals which are realizations of non-stationary stochastic processes expressed as time series. Thus, the matrix H be expected to evolve in time as a result of the non-stationarity of the source signals. The resultant time dependent family of information transfer matrices can, therefore, provide a structure that facilitates the analysis of the information content of, and the information codependence among, the subject signals.

The content of any given matrix in a population of information transfer matrices can be interpreted on the basis of the choices of grouping criteria (e.g., paired or ensemble), parametric dependence, the granularity of the analysis time instances, and duration of time considered.

An illustrative example for an estimator for distances between the probability structures of the subject processes is provided. In this example, the following choices can be made on the basis of circuit structure and expectations of process behavior (as manifested in observable signals):

subject processes are primary voltages on two branches of a distribution circuit, in which one branch hosts the connection of numerous smart-inverter-controlled residential scale photovoltaic arrays, and the other branch serving residential loads does not;

time series of the voltage processes are obtained by uniform time sampling, identical for both processes, having a sampling period of, for example, 2 seconds, 5 seconds, 7 seconds, 10 seconds, 15 seconds, or some other sampling period;

the voltage processes are observed at several points on each respective circuit branch (e.g., three points), and one such observation point may be a distributed voltage regulation transformer (e.g., a mid-line regulator);

the physical expectation is that the probabilistic distance between voltage processes on the circuit branches equipped as described will reveal a pattern which, in broad terms, manifest proximity (probabilistically speaking) when the photovoltaic arrays are not illuminated (night), and greater distance when the photovoltaic arrays are illuminated, since any variation in the insolation in real time will introduce into the circuit voltages a stochastic process having a probability structure that differs from that imposed on those voltages by the residential power demand processes;

the metric selected to quantify the resulting probabilistic distance is the Pearson $\chi^2$;

the choice of which density to use for distance weighting is the parameter;

the temporal granularity for evaluation of the information transfer matrix so constructed should be consistent with some interval for which the subject voltage processes may considered to be stationary (e.g., the measured variability of the process is unchanged to within statistical significance), which can be, for example, in the range of a few tens of minutes;

the duration of interest can be one solar day, as the processes can be repetitive based on this duration;

the selected discrimination metric is assessed upon pairs of time series, arranged in a matrix as described above, such that the column indices indicate the signals observed in one branch of the example circuit and the row indices indicate the signals observed in the other branch, ordered such that increasing index means greater physical distance from the common electrical connection point (that is, the branches share a common circuit node, where node can be interpreted as an electronic circuit.

Thus, the NCSD 155 can construct the information transfer matrices to expose the probabilistic distances between the voltage signals as observed at the metering sites in the circuit branches, as they vary with time over the daily consumer demand cycle; such distances depend on the probability characteristics of the subject processes. The NCSD 155 can detect forged or otherwise corrupted observed signals, because forged or corrupted observed signals may not emulate both the probability structures and the probabilistic relationships detected by the NCSD 155.

In another example, the NCSD 155 can populate the information transfer matrix for signals observed at multiple points on a single circuit branch, or a single circuit having multiple branches. The main diagonal ($h_{ik}$ where i=k) of the resulting information transfer matrix would thus comprise elements of value zero, since the distance between a signal and itself is zero. The symmetrical off-diagonal elements would be expected to have equal values as pairs; that is, $h_{ik}=h_{ki}$. The NCSD 155 generate various matrices by selecting the metric suitable for the qualifier or hypothesis to be examined, each directed towards some feature of the subject processes. The NCSD 155 can detect forged or otherwise corrupted observations by the failure of the forgery agent to emulate the characteristics of the stochastic processes.

To detect non-conforming signals, the NCSD 155 can establish a baseline or nominal set of metrics for one or more processes. The NCSD 155 can generate or establish the baseline without a priori knowledge of results. The NCSD 155 can establish or generate the baseline using signals or data that is representative of nominal uncorrupted measurement processes. As stated for each of the metrics, estimators and qualifiers, the nominal metric can be learned for the selected metric, estimator and qualifier using, for example, known good samples (e.g., absent errors, voids, deviations, corruption, or other faults).

The NCSD 155 can enter, trigger, or initiate a baseline metric or parameter generation mode to generate the baseline or nominal set of metrics. The NCSD 155 can enter the baseline generation mode when the NCSD 155 is initiated or brought online. The NCSD 155 can enter the baseline generation mode based on a time interval or periodically, such as every 24 hours, 48 hours, 72 hours, 7 days, 30 days, 60 days, 90 days, etc. The NCSD 155 can enter or initiate the baseline generation mode responsive to a trigger condition or event. For example, the NCSD 155 can enter the baseline generation mode responsive to determining there is sufficient time series data that qualifies for processing. The NCSD 155 can enter the baseline generation mode responsive to determining a change in condition, such as an environmental condition or parameter. The NCSD 155 can enter the baseline generation mode for one or more categories to generate a baseline or nominal set for each category. For example, the NCSD 155 can enter the baseline generation mode for different seasons (e.g., summer, fall, winter, or spring), weather conditions, temperature ranges, day or night. The NCSD 155 can enter the baseline generation mode to generate a baseline or nominal metrics for processes for each category. The NCSD 155 can re-enter the baseline generate mode to update metrics or parameter estimates.

The NCSD 155 can update or establish the baseline model responsive to detecting that the estimated parameters or metrics satisfy certain criteria. The NCSD 155 can compare the estimated parameter or metric with the criteria or thresholds or values associated with the criteria to determine whether the estimated parameter or metric satisfies the criteria. Responsive to determining that the estimated parameter or metric satisfy the criteria, the NCSD 155 can add the estimate to the baseline model, or update the baseline model with the estimated parameter or metric.

The NCSD 155 can include a deviation detector component 125 to detect a deviation in an estimated parameter or metric from a baseline or nominal parameter or metric. The NCSD 155 can estimate a magnitude, degree or amount of deviation from the baseline or nominal parameter or metric. The NCSD 155 can further identify a confidence level associated with the determined amount of deviation. The NCSD 155 can use both solitary and paired processes to determine the amount of deviation from the baseline.

The NCSD 155 can include a classifier component 130 to classify the deviation or amount of deviation. The NCSD 155 can determine the deviation using multiple estimators. The NCSD 155 can determine deviant behavior using solitary time series or of dependencies between multiple time series based on the estimators. The NCSD 155 can determine or identify estimated metrics, and detect a deviation of this metric from the generated baseline or nominal metric. The NCSD 155 can determine the amount of deviation as well as measure the level of confidence that the estimated metric deviates from the nominal metric. For example, the level of confidence that the estimated metric corresponds to a nominal metric.

The NCSD 155 can include an alert module 140 that can generate an alert based on the classification. The alert can include a report, notification, sound, light, signal, message, SMS message, text message, electronic mail, prompt, or other indicator. The alert module 140 can generate an alert including instructions. The instructions can include a command, control parameter, or configuration. The instructions can include an instruction to disable, reset, turn off, or turn on a device or component of the distribution grid 105.

For example, the NCSD 155 can determine, based on the detected deviation and classification, that a time series obtained from a first metering device in the distribution system 105 includes non-conforming or forged signals. The NCSD 155 can determine, based on the information transfer matrix, that a behavior of the first metering device and a second metering device on the same branch deviates from a nominal behavior between the first metering device and the second metering device. Responsive to detecting this deviation, the NCSD 155 can reset or reformat the first metering device to a previous state or configuration that was known to operate nominally. In some cases, the NCSD 155 can remotely reset, reformat, or reconfigure the first metering device.

In some cases, the NCSD 155 can instruct a service personnel to inspect the metering device or replace the metering device. For example, the NCSD 155 can first remotely reset or reconfigure the first metering device to determine if that can solve the problem. If the NCSD 155 determines that time series obtained subsequent to resetting the metering device exhibit deviations or non-conforming behavior, the NCSD 155 can disable the first metering device and instruct a service personal to inspect the first metering device. The service personnel, upon inspection can determine to repair or replace the first metering device.

Figure 2:
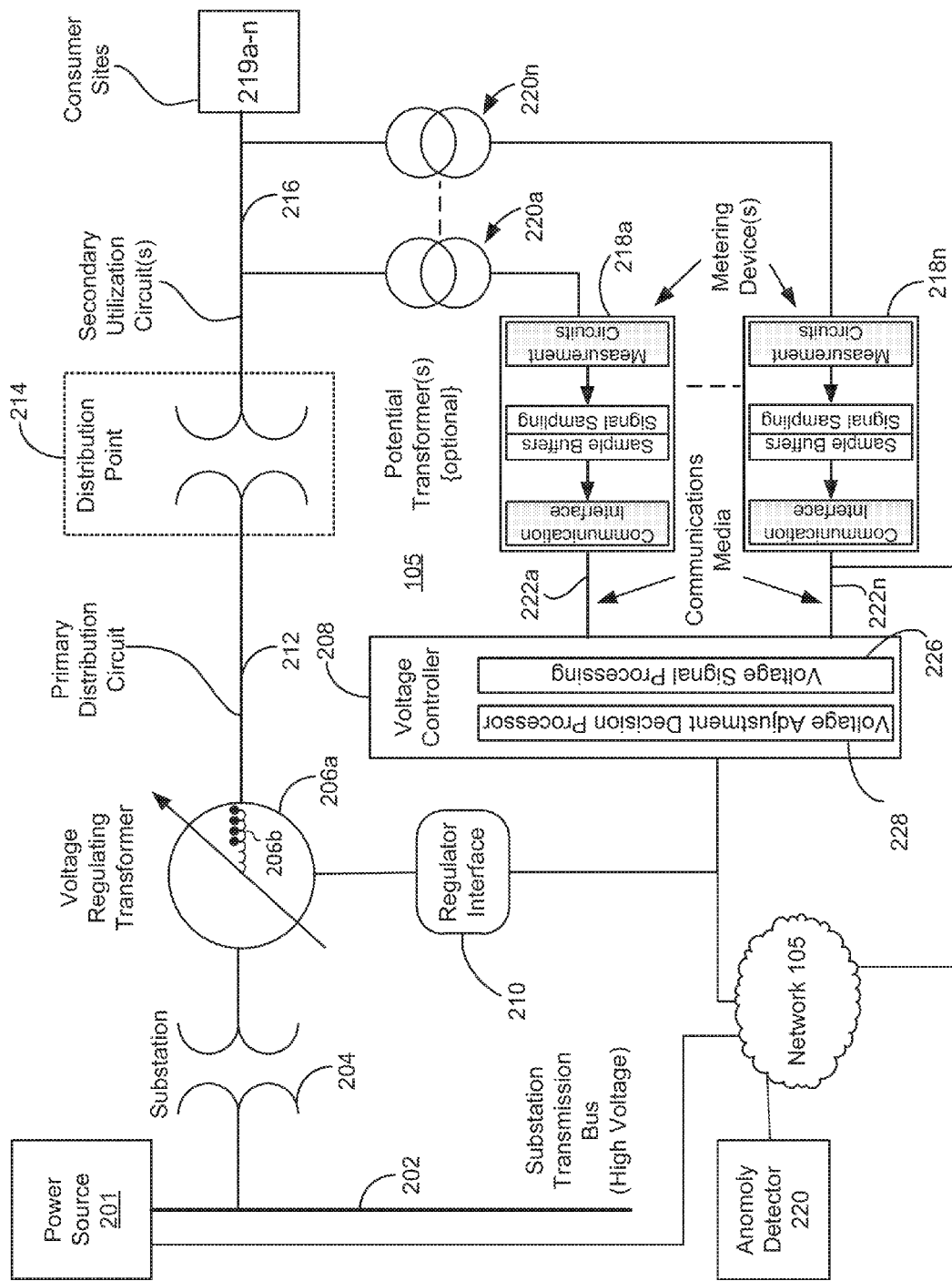
FIG. 2 is a block diagram depicting an illustrative utility grid in accordance with an embodiment.

FIG. 2 illustrates a utility grid 105 including an electricity distribution grid with several devices, assets, or digital computational devices and systems, such as computing device 200. In brief overview, the utility grid 105 includes a power source 201 that can be connected via a subsystem transmission bus 202 and/or via substation transformer 204 to a voltage regulating transformer 206a. The voltage regulating transformer 206a can be controlled by voltage controller 208 with regulator interface 210. Voltage regulating transformer 206a may be optionally coupled on primary distribution circuit 212 via optional distribution transformer 214 to secondary utilization circuits 216 and to one or more electrical or electronic devices 119. Voltage regulating transformer 206a can include multiple tap outputs 206b with each tap output 206b supplying electricity with a different voltage level. The utility grid 105 can include monitoring devices 218a-218n that may be coupled through optional potential transformers 220a-220n to secondary utilization circuits 216. The monitoring or metering devices 218a-218n may detect (e.g., continuously, periodically, based on a time interval, responsive to an event or trigger) measurements and continuous voltage signals of electricity supplied to one or more electrical devices 119 connected to circuit 212 or 216 from a power source 201 coupled to bus 202. A voltage controller 208 can receive, via a communication media 222, measurements obtained by the metering devices 218a-218n, and use the measurements to make a determination regarding a voltage tap settings, and provide an indication to regulator interface 210. The regulator interface can communicate with voltage regulating transformer 206a to adjust an output tap level 206b.

Still referring to FIG. 2, and in further detail, the utility grid 105 includes a power source 201. The power source 201 may include a generating station such as an installation configured to generate electrical power for distribution. The power source 201 may include an engine, a turbine or other apparatus that generates electrical power. The power source 201 may create electrical power by converting power or energy from one state to another state. In some embodiments, the power source 201 may be referred to or include a power plant, power station, generating station, powerhouse or generating plant. In some embodiments, the power source 201 may include a generator, such as a rotating machine that converts mechanical power into electrical power by creating relative motion between a magnetic field and a conductor. The power source 201 can use one or more energy source to turn the generator including, e.g., fossil fuels such as coal, oil, and natural gas, nuclear power, or cleaner renewable sources such as solar, wind, wave and hydroelectric.

In some embodiments, the utility grid 105 includes one or more substation transmission bus 202. The substation transmission bus 202 can include or refer to transmission tower, such as a structure (e.g., a steel lattice tower, concrete, wood, etc.), that supports an overhead power line used to distribute electricity from a power source 201 to a substation 204 or distribution point 214. Transmission towers 202 can be used in high-voltage AC and DC systems, and come in a wide variety of shapes and sizes. In an illustrative example, a transmission tower can range in height from 15 to 55 meters or up to several hundred meters. Transmission towers 202 can be of various types including, e.g., suspension, terminal, tension, and transposition. In some embodiments, the utility grid 105 may include underground power lines in addition to or instead of transmission towers 202.

In some embodiments, the utility gird 100 includes a substation 204 or electrical substation 204 or substation transformer 204. A substation may be part of an electrical generation, transmission, and distribution system. In some embodiments, the substation 204 transform voltage from high to low, or the reverse, or performs any of several other functions to facilitate the distribution of electricity. In some embodiments, the utility grid 105 may include several substations 204 between the power plant 201 and the consumer electrical devices 119 with electric power flowing through them at different voltage levels.

In some embodiments, the substations 204 may be remotely operated, supervised and controlled (e.g., via a supervisory system 130 or supervisory control and data acquisition system 130). A substation may include one or more transformers to change voltage levels between high transmission voltages and lower distribution voltages, or at the interconnection of two different transmission voltages.

The supervisory system 130 can communicate, interact or interface with substations 204 via network 140. In some cases, the supervisory system 130 can be located at or near a substation 204. In some cases, the substation 204 includes the supervisory system 130. The supervisory system 130 can be setup at the substation and connect with one or more components of the substation 204 via a private connection or a direct connection. The supervisory system 130 can be configured to automatically control the substation or one or more component of the utility grid 105.

The supervisory system 130 can be configured to perform data acquisition, supervision or control. The supervisory system 130 can perform data acquisition by acquiring, or collecting, data such as system measurements, process measurement signals, electrical quantities, measured analog current or voltage values or the open or closed status of contact points, or other related information including, for example:
- electrical measurements from distribution system instrumentation and control assets, including, e.g., voltage ("V"), current ("I"), power ("P"), reactive power ("Q"), apparent power ("S"), or harmonics;
- ambient condition measurements reported by distribution system instrumentation or ancillary instruments communicating with the supervisory system, including, e.g., temperature, humidity, or wind velocity;
- measurements originating in photovoltaic systems, including, e.g., the characterization of the electrical output of such systems and including solar irradiance (e.g., power per unit area received from the Sun in the form of electromagnetic radiation in the wavelength range of the measuring instrument), total solar irradiance (e.g., solar power over all wavelengths per unit area), or solar insolation (e.g., the amount of solar energy received per square centimeter per minute).

The acquired data can be used locally within the device collecting it, sent to another device in a substation, or sent from the substation to one or several databases for use by operators, engineers, planners, and administration.

The supervisory system 130 can facilitate supervising the utility grid or the substation via computer processes and providing personnel access to information. The supervisory system 130 can supervise, or monitor, the conditions and status of the utility grid 105 using this acquired data. The supervisory system 130 can display reports or alerts to operators or engineers of the utility grid 105. For example, operators and engineers can monitor the information remotely on computer displays and graphical wall displays or locally, at the device or substation, on front-panel displays and laptop computers.

The supervisory system 130 can control the substation or one or more digital computation device of the utility grid 105 by sending command messages to the digital computation device to operate. In some cases, an operator supervising the system can initiate commands from an operator console. Field personnel can also control digital computation devices using front-panel push buttons or a laptop computer. In some embodiments, the supervisory system 130 can automatically send a command, instruction or message to a digital computation device responsive to an alert or instruction received from the NCSD 155. The supervisory system 130 can, responsive to the alert, adjust an operation parameter of the digital computation device. For example, the supervisory system 130 can, responsive to the alert indicating that a digital computation device has been affected by an attack that causes an anomaly, disable the digital computation device, reset the digital computation device, restart the digital computation device, reset the digital computation device to factory settings, or apply a software patch or update to the digital computation device. In some cases, an operator, engineer or other personnel can adjust the operational parameter responsive to the report or alert. The operator, engineer or other personnel can adjust the operation parameter via the supervisory system 130, or may directly adjust the digital computation device via an input/output interface of the digital computation device.

The supervisory system 130 can perform power-system integration by communicating data to, from, or among metering devices, control devices, grid digital instrumentation, or remote users. Substation integration can refer to combining data from metering device local to a substation so that there is a single point of contact in the substation for instrumentation and control.

In some embodiments, the regulating transformer 206 is can include: (1) a multi-tap autotransformer (single or three phase), which are used for distribution; or (2) on-load tap changer (three phase transformer), which can be integrated into a substation transformer 204 and used for both transmission and distribution. The illustrated system described herein may be implemented as either a single-phase or three-phase distribution system. The utility grid 105 may include an alternative current (AC) power distribution system and the term voltage may refer to an "RMS Voltage", in some embodiments.

In some embodiments, the utility grid 105 includes a distribution point 214 or distribution transformer 214, which may refer to an electric power distribution system. In some embodiments, the distribution point 214 may be a final or near final stage in the delivery of electric power. For example, the distribution point 214 can carry electricity from the transmission system (which may include one or more transmission towers 202) to individual consumers 119. In some embodiments, the distribution system may include the substations 204 and connect to the transmission system to lower the transmission voltage to medium voltage ranging between 2 kV and 69 kV with the use of transformers, for example. Primary distribution lines or circuit 212 carry this medium voltage power to distribution transformers located near the customer's premises 119. Distribution transformers may further lower the voltage to the utilization voltage of appliances and may feed several customers 119 through secondary distribution lines or circuits 216 at this voltage. Commercial and residential customers 119 may be connected to the secondary distribution lines through service drops. In some embodiments, customers demanding high load may be connected directly at the primary distribution level or the sub-transmission level.

In some embodiments, the utility grid 105 includes or couples to one or more consumer sites 119. Consumer sites 119 may include, for example, a building, house, shopping mall, factory, office building, residential building, commercial building, stadium, movie theater, etc. The consumer sites 119 may be configured to receive electricity from the distribution point 214 via a power line (above ground or underground). In some embodiments, a consumer site 119 may be coupled to the distribution point 214 via a power line. In some embodiments, the consumer site 119 may be further coupled to a site meter 218a-n or advanced metering infrastructure ("AMI").

In some embodiments, the utility grid 105 includes site meters 218a-n or AMI. Site meters 218a-n can measure, collect, and analyze energy usage, and communicate with metering devices such as electricity meters, gas meters, heat meters, and water meters, either on request or on a schedule. Site meters 218a-n can include hardware, software, communications, consumer energy displays and controllers, customer associated systems, Meter Data Management (MDM) software, or supplier business systems. In some embodiments, the site meters 218a-n can obtain samples of electricity usage in real time or based on a time interval, and convey, transmit or otherwise provide the information. In some embodiments, the information collected by the site meter may be referred to as meter observations or metering observations and may include the samples of electricity usage. In some embodiments, the site meter 218a-n can convey the metering observations along with additional information such as a unique identifier of the site meter 218a-n, unique identifier of the consumer, a time stamp, date stamp, temperature reading, humidity reading, ambient temperature reading, etc. In some embodiments, each consumer site 119 (or electronic device) may include or be coupled to a corresponding site meter or monitoring device 218a-218n.

Monitoring devices 218a-218n may be coupled through communications media 222a-222n to voltage controller 208. Voltage controller 208 can compute (e.g., continuously or based on a time interval or responsive to a condition/event) values for electricity that facilitates regulating or controlling electricity supplied or provided via the utility grid. For example, the voltage controller 208 may compute estimated deviant voltage levels that the supplied electricity (e.g., supplied from power source 201) will not drop below or exceed as a result of varying electrical consumption by the one or more electrical devices 119. The deviant voltage levels may be computed based on a predetermined confidence level and the detected measurements. Voltage controller 208 can include a voltage signal processing circuit 226 that receives sampled signals from metering devices 218a-218n. Metering devices 218a-218n may process and sample the voltage signals such that the sampled voltage signals are sampled as a time series (e.g., uniform time series free of spectral aliases or non-uniform time series).

Voltage signal processing circuit 226 may receive signals via communications media 222a-n from metering devices 218a-n, process the signals, and feed them to voltage adjustment decision processor circuit 228. Although the term "circuit" is used in this description, the term is not meant to limit this disclosure to a particular type of hardware or design, and other terms known generally known such as the term "element", "hardware", "device" or "apparatus" could be used synonymously with or in place of term "circuit" and may perform the same function. For example, in some embodiments the functionality may be carried out using one or more digital processors, e.g., implementing one or more digital signal processing algorithms. Adjustment decision processor circuit 228 may determine a voltage location with respect to a defined decision boundary and set the tap position and settings in response to the determined location. For example, the adjustment decision processing circuit 228 in voltage controller 208 can compute a deviant voltage level that is used to adjust the voltage level output of electricity supplied to the electrical device. Thus, one of the multiple tap settings of regulating transformer 206 can be continuously selected by voltage controller 208 via regulator interface 210 to supply electricity to the one or more electrical devices based on the computed deviant voltage level. The voltage controller 208 may also receive information about voltage regulator transformer 206a or output tap settings 206b via the regulator interface 210. Regulator interface 210 may include a processor controlled circuit for selecting one of the multiple tap settings in voltage regulating transformer 206 in response to an indication signal from voltage controller 208. As the computed deviant voltage level changes, other tap settings 206b (or settings) of regulating transformer 206a are selected by voltage controller 208 to change the voltage level of the electricity supplied to the one or more electrical devices 119.

The network 140 may be connected via wired or wireless links. Wired links may include Digital Subscriber Line (DSL), coaxial cable lines, or optical fiber lines. The wireless links may include BLUETOOTH, Wi-Fi, Worldwide Interoperability for Microwave Access (WiMAX), an infrared channel or satellite band. The wireless links may also include any cellular network standards used to communicate among mobile devices, including standards that qualify as 1G, 2G, 3G, or 4G. The network standards may qualify as one or more generation of mobile telecommunication standards by fulfilling a specification or standards such as the specifications maintained by International Telecommunication Union. The 3G standards, for example, may correspond to the International Mobile Telecommunications-2000 (IMT-2000) specification, and the 4G standards may correspond to the International Mobile Telecommunications Advanced (IMT-Advanced) specification. Examples of cellular network standards include AMPS, GSM, GPRS, UMTS, LTE, LTE Advanced, Mobile WiMAX, and WiMAX-Advanced. Cellular network standards may use various channel access methods e.g. FDMA, TDMA, CDMA, or SDMA. In some embodiments, different types of data may be transmitted via different links and standards. In other embodiments, the same types of data may be transmitted via different links and standards.

The network 140 may be any type and/or form of network. The geographical scope of the network 140 may vary widely and the network 140 can be a body area network (BAN), a personal area network (PAN), a local-area network (LAN), e.g. Intranet, a metropolitan area network (MAN), a wide area network (WAN), or the Internet. The topology of the network 140 may be of any form and may include, e.g., any of the following: point-to-point, bus, star, ring, mesh, or tree. The network 140 may be an overlay network which is virtual and sits on top of one or more layers of other networks 204'. The network 140 may be of any such network topology as known to those ordinarily skilled in the art capable of supporting the operations described herein. The network 140 may utilize different techniques and layers or stacks of protocols, including, e.g., the Ethernet protocol, the internet protocol suite (TCP/IP), the ATM (Asynchronous Transfer Mode) technique, the SONET (Synchronous Optical Networking) protocol, or the SDH (Synchronous Digital Hierarchy) protocol. The TCP/IP internet protocol suite may include application layer, transport layer, internet layer (including, e.g., IPv6), or the link layer. The network 140 may be a type of a broadcast network, a telecommunications network, a data communication network, or a computer network.

One or more components, assets, or devices of utility grid 105 may communicate via network 140. The utility grid 105 can one or more networks, such as public or private networks. The utility grid 105 can include an anomaly detector 200 designed and constructed to communicate or interface with utility grid 105 via network 140. Each asset, device, or component of utility grid 105 can include one or more computing devices 200 or a portion of computing 200 or a some or all functionality of computing device 200.

Figure 3:
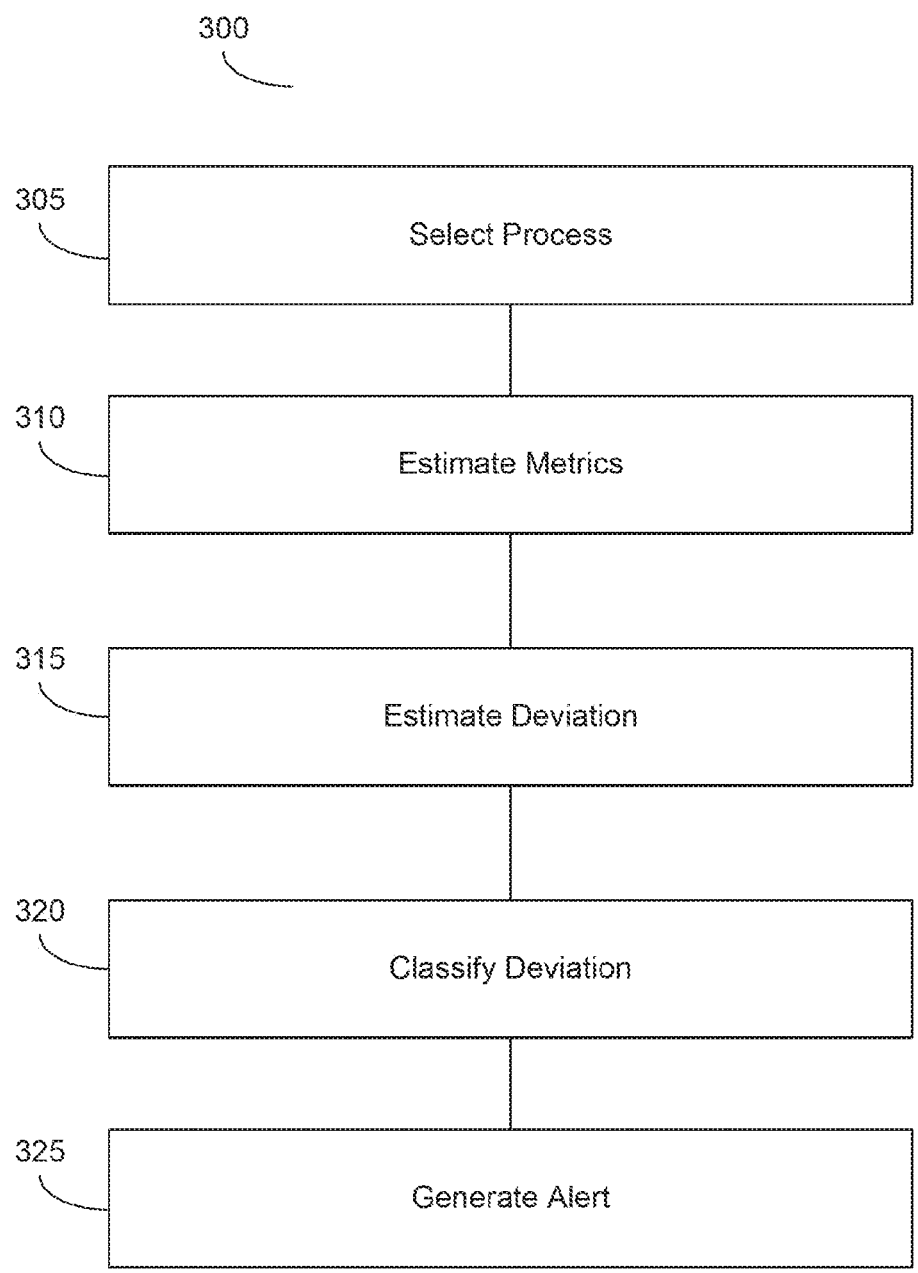
FIG. 3 is a flow chart depicting a method for detecting non-conforming signals in accordance with an embodiment.

Referring now to FIG. 3, is a flow chart depicting a method for detecting non-conforming signals in accordance with an embodiment is shown. The method 300 can be performed by one or more component, module or element depicted in FIG. 1, 2, 5A or 5B. In brief overview, the method 300 can include a non-conforming signal detector ("NCSD") selecting one or more time series corresponding to one or more processes at step 305. At step 310, the NCSD can estimate metrics for the selected one or more processes. At step 315, the NCSD can estimate a deviation from the estimated metrics to a nominal behavior. At step 320, the NCSD can classify the deviation. At step 325, the NCSD can generate an alert based on the classification of the deviation.

Still referring to FIG. 3, and in further detail, the NCSD can select one or more time series corresponding to one or more processes at step 305. The NCSD can identify processes in a distribution system or utility grid. The NCSD can identify, receive, or otherwise obtain time series information for the processes. For example, a metering device can observe measurements of various processes or characteristics of electricity in the distribution system.

The NCSD can select the process based on a type of process. For example, the NCSD can select a solitary process that is independent, or a paired process that is expected to have a level of dependency. Two processes can be paired together based on a level of connectivity or interrelatedness in the distribution system. For example, the NCSD can select signals and group them for further processing in based on various configurations of the distribution system including, for example, long rural circuits with multiple metering sites associated with control elements, networked circuits with multiple sources of power supply, or sites selected from multiple circuits having a common source (e.g. voltage regulating transformer, load tap changer, or on-load tap changer). By grouping signals and analyzing them as an ensemble of two or more, the NCSD can form elements of an information transfer matrix.

In some implementations, the NCSD can prepare or qualify the time series. The NCSD can manipulate or improve the data of the time series by smoothing the data, applying a filter, or filling in void samples. The NCSD can prepare the time series by performing binning, filtering, weighting, or smoothing the time series data. The NCSD can determine whether the data set qualifies for further processing using a qualification criteria, such as a number of samples, acceptable sample values, or number of void samples. The NCSD can evaluate the time series data for any errors, faults, missing data, void data, or otherwise erroneous data values (e.g., null values or formatting errors).

At step 310, the NCSD can estimate metrics for the selected one or more processes. The NCSD can apply one or more estimator to determine metrics or parameters of the processes. Metrics can include, for example, non-parametric metrics such as moments, correlations, nearest neighbor classification, all applicable to N time series involving, for example, cross-correlations. The NCSD can determine probability metrics, such as parameters derived from a density estimate, in turn obtained by simple binning, or by a kernel estimator, or by Bayesian inference on the basis of an assumed theoretical density. The NCSD can determine information metrics, such as entropic measures, the Gibbs measure, and mutual entropy measures (eg Kullback-Leibler divergence), or differential entropy measures such as the Fisher Information; The NCSD can determine causality metrics, which are applicable for $N \geq 2$, including for example the Granger Causality or any form of Transfer Entropy.

The NCSD can use the same or different estimators for analyzing solitary processes, paired processes or an ensemble of processes grouped together. For example, for the paired analysis, the NCSD can determine statistical cross-moments or multivariate moments. The NCSD can determine metrics such as correlation or orthogonality. To determine these statistical cross-moment metrics, the NCSD can use estimators such as covariance or cumulants of second or higher order. The NCSD can qualify these metrics or the estimates of these metrics using confidence measures or other types of qualifiers.

At step 315, the NCSD can estimate a deviation from the estimated metrics to a nominal behavior. The NCSD can retrieve, from a database stored in memory, nominal metrics for the type of process. The NCSD can compare the estimated metrics with the stored nominal metrics to identify a deviation. The deviation can include a magnitude of deviation, or other type of deviation (e.g., deviation in behavior or operation).

At step 320, the NCSD can classify the deviation. The NCSD can associate the deviation with a category. The NCSD can classify the deviation based on the magnitude or amount of deviation, or the type of deviation. The NCSD can grade the deviation. The grade can include, for example, a numerical score, letter grade, symbol, or category (e.g., low deviation, medium deviation, high deviation). The NCSD can classify the deviation based on historical deviations.

At step 325, the NCSD can generate an alert based on the classification of the deviation. Responsive to detecting the deviation, the NCSD can generate an alert or report indicating a source of the deviation, processes or metrics associated with the deviation, metering devices corresponding to processes associated with the deviation, or the classification of the deviation. In some embodiments, the NCSD can identify the metering device that is the source of the deviation, and generate an instruction to restart, reformat, or repair the metering device.

Figure 4:
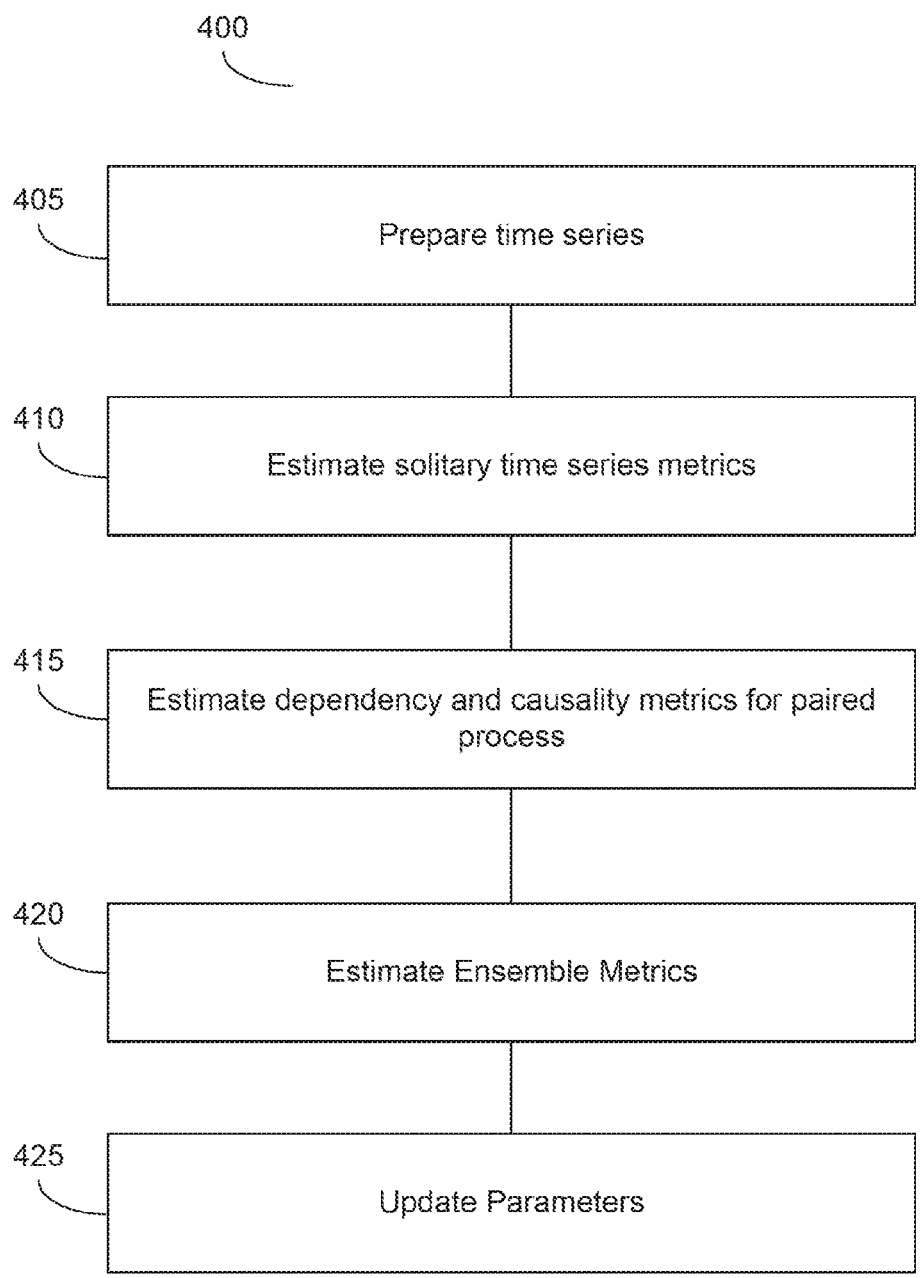
FIG. 4 is a flow chart depicting a method for estimating parameters of metrics in accordance with an embodiment.

Referring now to FIG. 4, a flow chart depicting a method for estimating parameters of metrics in accordance with an embodiment is shown. The method 400 can be performed by one or more component, module or element depicted in FIG. 1, 2, 5A or 5B. The method 400 can be performed to establish nominal metrics or nominal behavior from which the NCSD can detect deviations. In brief overview, a non-conforming signal detector ("NCSD") can prepare a time series at step 405. At step 410, the NCSD can estimate solitary time series metrics. At step 415, the NCSD can estimate dependency and causality metrics for paired processes. At step 420, the NCSD can estimate ensemble metrics. At step 425, the NCSD can update parameters.

In further detail, the NCSD can prepare a time series at step 405. The NCSD can prepare and qualify the time series. The NCSD can apply one or more pre-processing techniques to prepare the time series. The NCSD can apply a filter, binning, weighting or other technique to manipulate the time series data to smooth or improve the data. The NCSD can further qualify the time series by comparing it with qualification criteria.

At step 410, the NCSD can estimate solitary time series metrics. For example, for the solitary time series, the NCSD can determine metrics such as univariate central moments, which can be computed from the samples of the time series, autocorrelation sequence, or power spectra. The NCSD can determine or estimate these metrics using hypothesis tests or robust outlier content. The NCSD can qualify these metrics or the estimates of these metrics using confidence measures.

At step 415 and 420, the NCSD can estimate dependency and causality metrics for paired processes. The NCSD can perform group process analysis by determining metrics for ensembles of N time series (where N is at least 2) in which each member time series is physically co-dependent with at least one other member time series, including possibly some degree of causal dependence. By grouping signals and analyzing them in pairs of two or more, the NCSD can form elements of an information transfer matrix.

The NCSD can use the same or different estimators for analyzing paired processes or an ensemble of processes grouped together. For example, for the paired analysis, the NCSD can determine statistical cross-moments or multivariate moments. The NCSD can determine metrics such as correlation or orthogonality. To determine these statistical cross-moment metrics, the NCSD can use estimators such as covariance or cumulants of second or higher order. The NCSD can qualify these metrics or the estimates of these metrics using confidence measures or other types of qualifiers. The grouped processes can additionally indicate ensemble co-dependence, in turn revealing a structure of co-dependence amongst paired processes selected such that the dependence measures may be arranged as a matrix which will be termed the information transfer matrix.

At step 425, the NCSD can update parameters. The NCSD can update a database or other data repository storing nominal parameters or metrics. The NCSD can compare the estimated parameters or metrics with the nominal metrics and determine to update the parameters if the NCSD determines that the current parameters are improved indicators of nominal behavior. For example, if there is a seasonal change, temperature change, time of day, or other environmental or temporal characteristics that can influence the parameters or the dependency, then the NCSD can update the parameters in the database, or establish a second set of parameters in the database for the new environmental condition. In some implementations, the NCSD can update the parameters on a periodic basis, such as hourly, daily, every 48 hours, 72 hours, weekly, bi-weekly, monthly, every 60 days or some other time interval. In some implementations, the NCSD can update the parameters responsive to an indication or instruction to update the parameters. In some implementations, the NCSD can update the parameters responsive to an event, such as a change in instrumentation, change in consumer sites, change in consumer behavior, or other change in the distribution system.

Figure 5A:
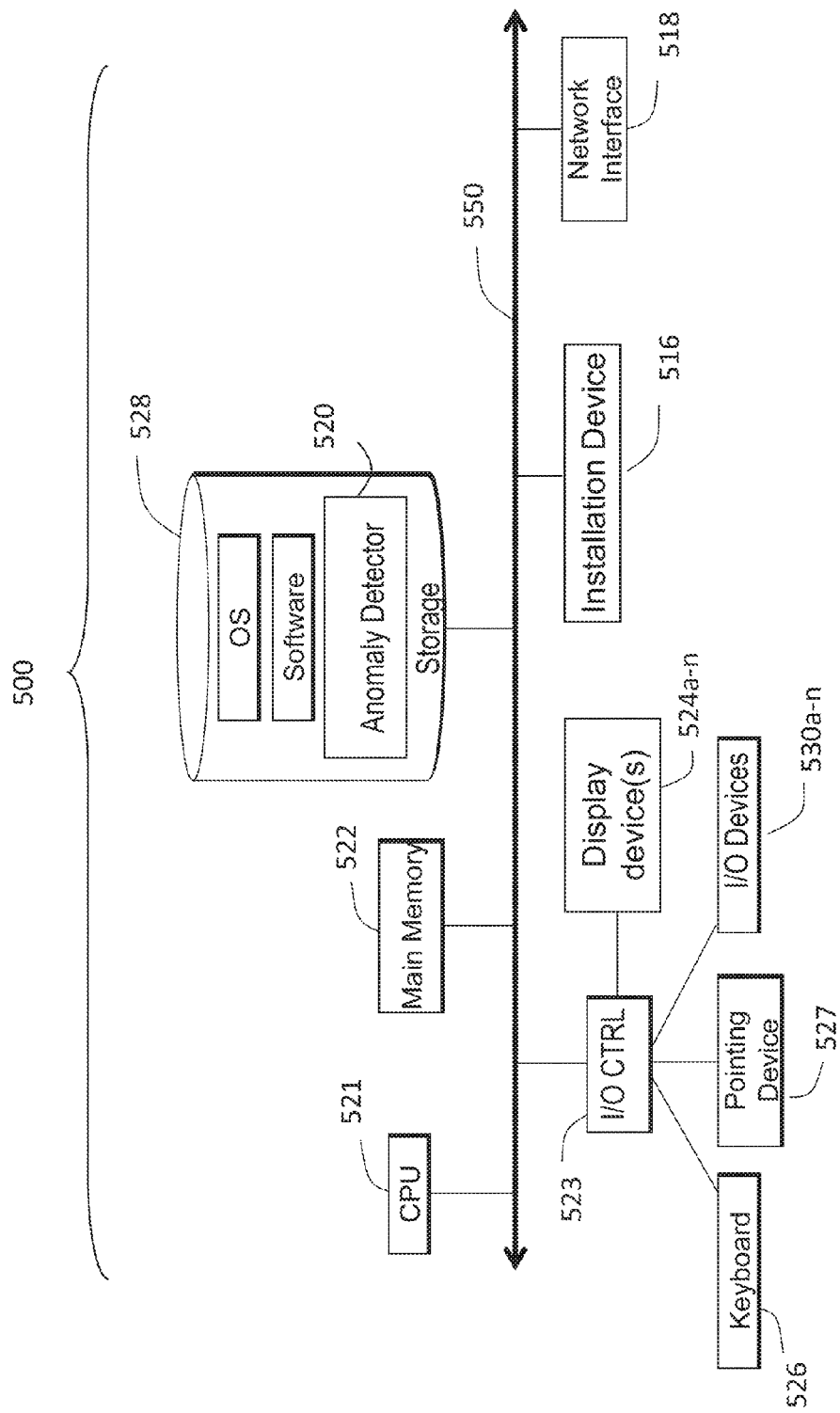
FIGS. 5A and 5B are block diagrams depicting embodiments of computing devices useful in connection with the systems and methods described herein.
Figure 5B:
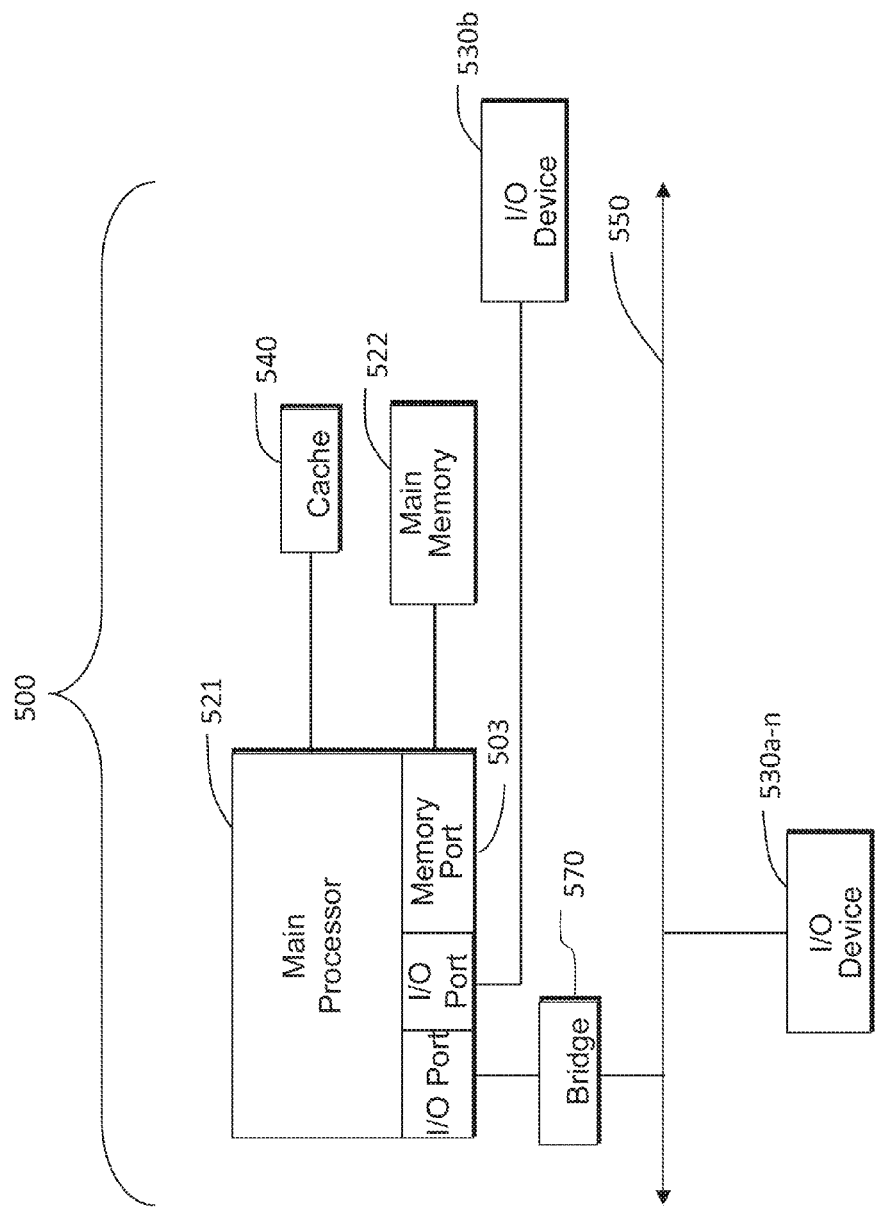

FIGS. 5A and 5B depict block diagrams of a computing device 500 that can be used or configured to perform one or more function or aspect, or included in one or more component in FIG. 1, 2, 3 or 4. As shown in FIGS. 5A and 5B, each computing device 500 includes a central processing unit 521, and a main memory unit 522. As shown in FIG. 5A, a computing device 500 may include a storage device 528, an installation device 516, a network interface 518, an I/O controller 521, display devices 524a-524n, a keyboard 526 and a pointing device 527, e.g. a mouse. The storage device 528 may include, without limitation, an operating system, software, and a software of a geographical ticker system (GTS) 220. As shown in FIG. 5B, each computing device 500 may also include additional optional elements, e.g. a memory port 503, a bridge 570, one or more input/output devices 530a-530n (generally referred to using reference numeral 530), and a cache memory 540 in communication with the central processing unit 521.

The central processing unit 521 is any logic circuitry that responds to and processes instructions fetched from the main memory unit 522. In many embodiments, the central processing unit 521 is provided by a microprocessor unit, e.g.: those manufactured by Intel Corporation of Mountain View, Calif.; those manufactured by Motorola Corporation of Schaumburg, Ill.; the ARM processor and TEGRA system on a chip (SoC) manufactured by Nvidia of Santa Clara, Calif.; the POWER7 processor, those manufactured by International Business Machines of White Plains, N.Y.; or those manufactured by Advanced Micro Devices of Sunnyvale, Calif. The computing device 500 may be based on any of these processors, or any other processor capable of operating as described herein. The central processing unit 521 may utilize instruction level parallelism, thread level parallelism, different levels of cache, and multi-core processors. A multi-core processor may include two or more processing units on a single computing component. Examples of multi-core processors include the AMD PHENOM IIX2, INTEL CORE i5 and INTEL CORE i7.

Main memory unit 522 may include one or more memory chips capable of storing data and allowing any storage location to be directly accessed by the microprocessor 521. Main memory unit 522 may be volatile and faster than storage 528 memory. Main memory units 522 may be Dynamic random access memory (DRAM) or any variants, including static random access memory (SRAM), Burst SRAM or SynchBurst SRAM (BSRAM), Fast Page Mode DRAM (FPM DRAM), Enhanced DRAM (EDRAM), Extended Data Output RAM (EDO RAM), Extended Data Output DRAM (EDO DRAM), Burst Extended Data Output DRAM (BEDO DRAM), Single Data Rate Synchronous DRAM (SDR SDRAM), Double Data Rate SDRAM (DDR SDRAM), Direct Rambus DRAM (DRDRAM), or Extreme Data Rate DRAM (XDR DRAM). In some embodiments, the main memory 522 or the storage 528 may be non-volatile; e.g., non-volatile read access memory (NVRAM), flash memory non-volatile static RANI (nvSRAM), Ferro-electric RANI (FeRAM), Magnetoresistive RANI (MRAM), Phase-change memory (PRAM), conductive-bridging RAM (CBRAIVI), Silicon-Oxide-Nitride-Oxide-Silicon (SO-NOS), Resistive RAM (RRAIVI), Racetrack, Nano-RAM (NRAM), or Millipede memory. The main memory 522 may be based on any of the above described memory chips, or any other available memory chips capable of operating as described herein. In the embodiment shown in FIG. 5A, the processor 521 communicates with main memory 522 via a system bus 550 (described in more detail below). FIG. 5B depicts an embodiment of a computing device 500 in which the processor communicates directly with main memory 522 via a memory port 503. For example, in FIG. 5B the main memory 522 may be DRDRAM.

FIG. 5B depicts an embodiment in which the main processor 521 communicates directly with cache memory 540 via a secondary bus, sometimes referred to as a backside bus. In other embodiments, the main processor 521 communicates with cache memory 540 using the system bus 550. Cache memory 540 typically has a faster response time than main memory 522 and is typically provided by SRAM, BSRAM, or EDRAM. In the embodiment shown in FIG. 5B, the processor 521 communicates with various I/O devices 530 via a local system bus 550. Various buses may be used to connect the central processing unit 521 to any of the I/O devices 530, including a PCI bus, a PCI-X bus, or a PCI-Express bus, or a NuBus. For embodiments in which the I/O device is a video display 524, the processor 521 may use an Advanced Graphics Port (AGP) to communicate with the display 524 or the I/O controller 523 for the display 524. FIG. 5B depicts an embodiment of a computer 500 in which the main processor 521 communicates directly with I/O device 530b or other processors 521' via HYPERTRANSPORT, RAPIDIO, or INFINIBAND communications technology. FIG. 5B also depicts an embodiment in which local busses and direct communication are mixed: the processor 521 communicates with I/O device 530a using a local interconnect bus while communicating with I/O device 530b directly.

A wide variety of I/O devices 530a-530n may be present in the computing device 500. Input devices may include keyboards, mice, trackpads, trackballs, touchpads, touch mice, multi-touch touchpads and touch mice, microphones, multi-array microphones, drawing tablets, cameras, single-lens reflex camera (SLR), digital SLR (DSLR), CMOS sensors, accelerometers, infrared optical sensors, pressure sensors, magnetometer sensors, angular rate sensors, depth sensors, proximity sensors, ambient light sensors, gyroscopic sensors, or other sensors. Output devices may include video displays, graphical displays, speakers, headphones, inkjet printers, laser printers, and 3D printers.

Devices 530a-530n may include a combination of multiple input or output devices, including, e.g., Microsoft KINECT, Nintendo Wiimote for the WII, Nintendo WII U GAMEPAD, or Apple IPHONE. Some devices 530a-530n allow gesture recognition inputs through combining some of the inputs and outputs. Some devices 530a-530n provides for facial recognition which may be utilized as an input for different purposes including authentication and other commands. Some devices 530a-530n provides for voice recognition and inputs, including, e.g., Microsoft KINECT, SIRI for IPHONE by Apple, Google Now or Google Voice Search.

Additional devices 530a-530n have both input and output capabilities, including, e.g., haptic feedback devices, touchscreen displays, or multi-touch displays. Touchscreen, multi-touch displays, touchpads, touch mice, or other touch sensing devices may use different technologies to sense touch, including, e.g., capacitive, surface capacitive, projected capacitive touch (PCT), in-cell capacitive, resistive, infrared, waveguide, dispersive signal touch (DST), in-cell optical, surface acoustic wave (SAW), bending wave touch (BWT), or force-based sensing technologies. Some multi-touch devices may allow two or more contact points with the surface, allowing advanced functionality including, e.g., pinch, spread, rotate, scroll, or other gestures. Some touchscreen devices, including, e.g., Microsoft PIXELSENSE or Multi-Touch Collaboration Wall, may have larger surfaces, such as on a table-top or on a wall, and may also interact with other electronic devices. Some I/O devices 530a-530n, display devices 524a-524n or group of devices may be augment reality devices. The I/O devices may be controlled by an I/O controller 523 as shown in FIG. 5A. The I/O controller may control one or more I/O devices, such as, e.g., a keyboard 126 and a pointing device 527, e.g., a mouse or optical pen. Furthermore, an I/O device may also provide storage and/or an installation medium 116 for the computing device 500. In still other embodiments, the computing device 500 may provide USB connections (not shown) to receive handheld USB storage devices. In further embodiments, an I/O device 530 may be a bridge between the system bus 550 and an external communication bus, e.g. a USB bus, a SCSI bus, a FireWire bus, an Ethernet bus, a Gigabit Ethernet bus, a Fibre Channel bus, or a Thunderbolt bus.

In some embodiments, display devices 524a-524n may be connected to I/O controller 521. Display devices may include, e.g., liquid crystal displays (LCD), thin film transistor LCD (TFT-LCD), blue phase LCD, electronic papers (e-ink) displays, flexile displays, light emitting diode displays (LED), digital light processing (DLP) displays, liquid crystal on silicon (LCOS) displays, organic light-emitting diode (OLED) displays, active-matrix organic light-emitting diode (AMOLED) displays, liquid crystal laser displays, time-multiplexed optical shutter (TMOS) displays, or 3D displays. Examples of 3D displays may use, e.g. stereoscopy, polarization filters, active shutters, or autostereoscopy. Display devices 524a-524n may also be a head-mounted display (HMD). In some embodiments, display devices 524a-524n or the corresponding I/O controllers 521 may be controlled through or have hardware support for OPENGL or DIRECTX API or other graphics libraries.

In some embodiments, the computing device 500 may include or connect to multiple display devices 524a-524n, which each may be of the same or different type and/or form. As such, any of the I/O devices 530a-530n and/or the I/O controller 521 may include any type and/or form of suitable hardware, software, or combination of hardware and software to support, enable or provide for the connection and use of multiple display devices 524a-524n by the computing device 500. For example, the computing device 500 may include any type and/or form of video adapter, video card, driver, and/or library to interface, communicate, connect or otherwise use the display devices 524a-524n. In one embodiment, a video adapter may include multiple connectors to interface to multiple display devices 524a-524n. In other embodiments, the computing device 500 may include multiple video adapters, with each video adapter connected to one or more of the display devices 524a-524n. In some embodiments, any portion of the operating system of the computing device 500 may be configured for using multiple displays 524a-524n. In other embodiments, one or more of the display devices 524a-524n may be provided by one or more other computing devices 500a or 500b connected to the computing device 500, via the network 104. In some embodiments software may be designed and constructed to use another computer's display device as a second display device 524a for the computing device 500. For example, in one embodiment, an Apple iPad may connect to a computing device 500 and use the display of the device 500 as an additional display screen that may be used as an extended desktop. One ordinarily skilled in the art will recognize and appreciate the various ways and embodiments that a computing device 500 may be configured to have multiple display devices 524a-524n.

Referring again to FIG. 5A, the computing device 500 may comprise a storage device 528 (e.g. one or more hard disk drives or redundant arrays of independent disks) for storing an operating system or other related software, and for storing application software programs such as any program related to the software 220 for the geographical ticker system. Examples of storage device 528 include, e.g., hard disk drive (HDD); optical drive including CD drive, DVD drive, or BLU-RAY drive; solid-state drive (SSD); USB flash drive; or any other device suitable for storing data. Some storage devices may include multiple volatile and non-volatile memories, including, e.g., solid state hybrid drives that combine hard disks with solid state cache. Some storage device 528 may be non-volatile, mutable, or read-only. Some storage device 528 may be internal and connect to the computing device 500 via a bus 550. Some storage device 528 may be external and connect to the computing device 500 via a I/O device 530 that provides an external bus. Some storage device 528 may connect to the computing device 500 via the network interface 518 over a network 104, including, e.g., the Remote Disk for MACBOOK AIR by Apple. Some client devices 500 may not require a non-volatile storage device 528 and may be thin clients or zero clients 502. Some storage device 528 may also be used as an installation device 516, and may be suitable for installing software and programs. Additionally, the operating system and the software can be run from a bootable medium, for example, a bootable CD, e.g. KNOPPIX, a bootable CD for GNU/Linux that is available as a GNU/Linux distribution from knoppix.net.

Computing device 500 may also install software or application from an application distribution platform. Examples of application distribution platforms include the App Store for iOS provided by Apple, Inc., the Mac App Store provided by Apple, Inc., GOOGLE PLAY for Android OS provided by Google Inc., Chrome Webstore for CHROME OS provided by Google Inc., and Amazon Appstore for Android OS and KINDLE FIRE provided by Amazon.com, Inc.

Furthermore, the computing device 500 may include a network interface 518 to interface to the network 104 through a variety of connections including, but not limited to, standard telephone lines LAN or WAN links (e.g., 802.11, T1, T3, Gigabit Ethernet, Infiniband), broadband connections (e.g., ISDN, Frame Relay, ATM, Gigabit Ethernet, Ethernet-over-SONET, ADSL, VDSL, BPON, GPON, fiber optical including FiOS), wireless connections, or some combination of any or all of the above. Connections can be established using a variety of communication protocols (e.g., TCP/IP, Ethernet, ARCNET, SONET, SDH, Fiber Distributed Data Interface (FDDI), IEEE 802.11a/b/g/n/ac CDMA, GSM, WiMax and direct asynchronous connections). In one embodiment, the computing device 500 communicates with other computing devices 500' via any type and/or form of gateway or tunneling protocol e.g. Secure Socket Layer (SSL) or Transport Layer Security (TLS), or the Citrix Gateway Protocol manufactured by Citrix Systems, Inc. of Ft. Lauderdale, Fla. The network interface 118 may comprise a built-in network adapter, network interface card, PCMCIA network card, EXPRESSCARD network card, card bus network adapter, wireless network adapter, USB network adapter, modem or any other device suitable for interfacing the computing device 500 to any type of network capable of communication and performing the operations described herein.

A computing device 500 of the sort depicted in FIG. 5A may operate under the control of an operating system, which controls scheduling of tasks and access to system resources. The computing device 500 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: WINDOWS 5000, WINDOWS Server 2012, WINDOWS CE, WINDOWS Phone, WINDOWS XP, WINDOWS VISTA, and WINDOWS 7, WINDOWS RT, and WINDOWS 8 all of which are manufactured by Microsoft Corporation of Redmond, Wash.; MAC OS and iOS, manufactured by Apple, Inc. of Cupertino, Calif.; and Linux, a freely-available operating system, e.g. Linux Mint distribution ("distro") or Ubuntu, distributed by Canonical Ltd. of London, United Kingom; or Unix or other Unix-like derivative operating systems; and Android, designed by Google, of Mountain View, Calif., among others. Some operating systems, including, e.g., the CHROME OS by Google, may be used on zero clients or thin clients, including, e.g., CHROMEBOOKS.

The computer system 500 can be any workstation, telephone, desktop computer, laptop or notebook computer, netbook, ULTRABOOK, tablet, server, handheld computer, mobile telephone, smartphone or other portable telecommunications device, media playing device, a gaming system, mobile computing device, or any other type and/or form of computing, telecommunications or media device that is capable of communication. The computer system 500 has sufficient processor power and memory capacity to perform the operations described herein. In some embodiments, the computing device 500 may have different processors, operating systems, and input devices consistent with the device. The Samsung GALAXY smartphones, e.g., operate under the control of Android operating system developed by Google, Inc. GALAXY smartphones receive input via a touch interface.

In some embodiments, the computing device 500 is a gaming system. For example, the computer system 500 may comprise a PLAYSTATION 3, or PERSONAL PLAYSTATION PORTABLE (PSP), or a PLAYSTATION VITA device manufactured by the Sony Corporation of Tokyo, Japan, a NINTENDO DS, NINTENDO 3DS, NINTENDO WII, or a NINTENDO WII U device manufactured by Nintendo Co., Ltd., of Kyoto, Japan, an XBOX 360 device manufactured by the Microsoft Corporation of Redmond, Wash.

In some embodiments, the computing device 500 is a digital audio player such as the Apple IPOD, IPOD Touch, and IPOD NANO lines of devices, manufactured by Apple Computer of Cupertino, Calif. Some digital audio players may have other functionality, including, e.g., a gaming system or any functionality made available by an application from a digital application distribution platform. For example, the IPOD Touch may access the Apple App Store. In some embodiments, the computing device 500 is a portable media player or digital audio player supporting file formats including, but not limited to, MP3, WAV, M4A/AAC, WMA Protected AAC, AIFF, Audible audiobook, Apple Lossless audio file formats and .mov, .m4v, and .mp4 MPEG-4 (H.264/MPEG-4 AVC) video file formats.

In some embodiments, the status of one or more machines 500 in the network 104 are monitored, generally as part of network management. In one of these embodiments, the status of a machine may include an identification of load information (e.g., the number of processes on the machine, CPU 221 and memory utilization), of port information (e.g., the number of available communication ports and the port addresses), or of session status (e.g., the duration and type of processes, and whether a process is active or idle). In another of these embodiments, this information may be identified by a plurality of metrics, and the plurality of metrics can be applied at least in part towards decisions in load distribution, network traffic management, and network failure recovery as well as any aspects of operations of the present solution described herein. Aspects of the operating environments and components described above will become apparent in the context of the systems and methods disclosed herein.

Figure 6:
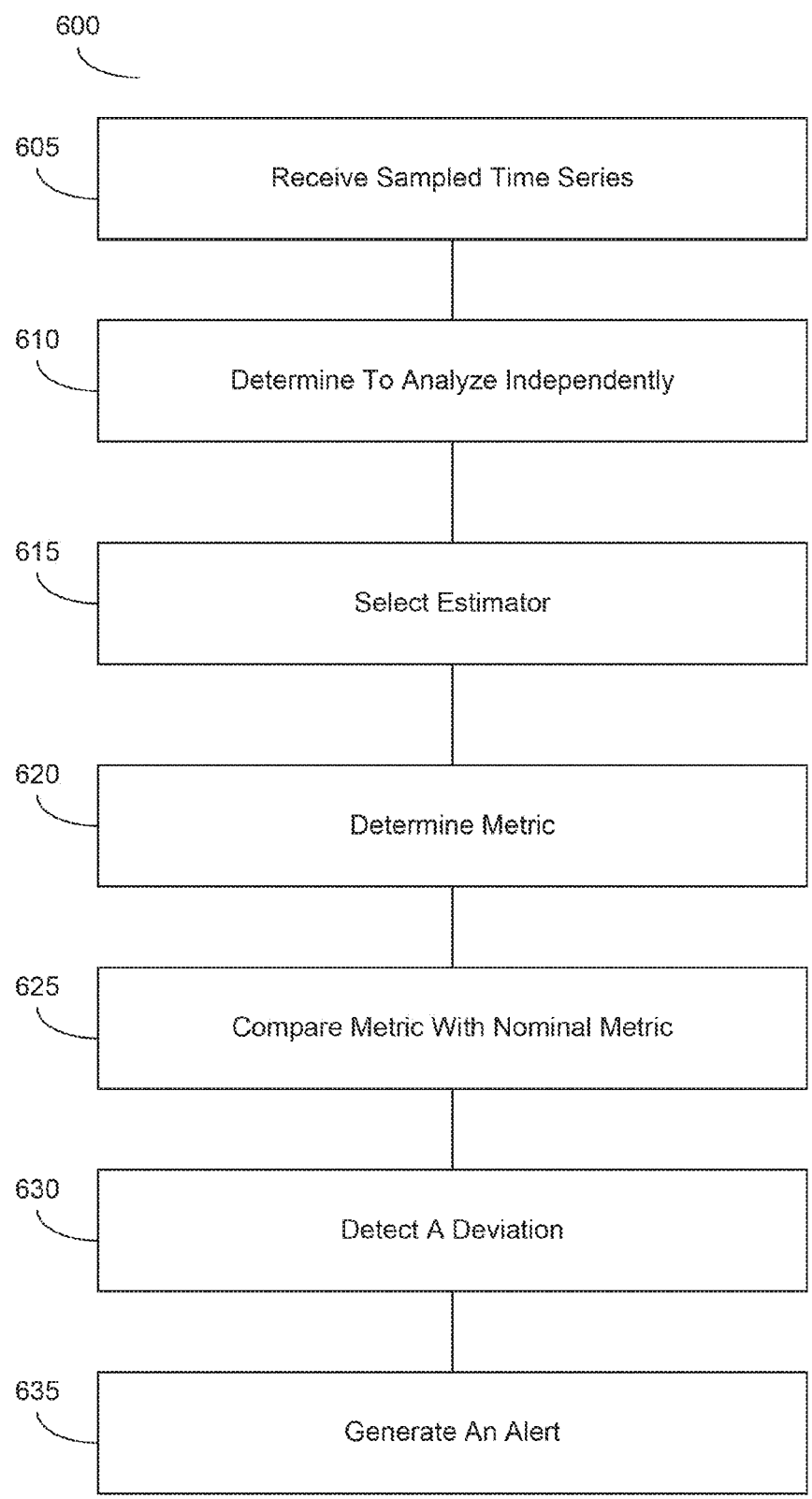
FIG. 6 is a flow chart depicting a method of detecting signal deviations in a utility grid in accordance with an embodiment.

Referring now to FIG. 6, a flow chart depicting a method of detecting signal deviations in a utility grid in accordance with an embodiment is shown. The method 600 can be performed by one or more component, module or element depicted in FIG. 1, 2, 5A or 5B. In brief overview, a non-conforming signal detector ("NCSD") can receive sampled time series at step 605. At step 610, the NCSD can determine to analyze the sampled time series independently. At step 615, the NCSD can select an estimator. At step 620, the NCSD can determine a metric. At step 625, the NCSD can compare the metric with a nominal metric. At step 630, the NCSD can detect a deviation. At step 635, the NCSD can generate an alert.

Still referring to FIG. 6, and in further detail, the NCSD can receive a sampled time series at step 605. The NCSD can receive a sampled time series of a signal. The signal can correspond to a process or an operational characteristic of electricity in a utility grid. The signal can indicate, for example, a voltage, current, power, energy, or an event. The signal can be sampled at a sampling interval by a metering device or a digital device to create the sampled time series of the signal. The digital device can be connected to the utility grid. The digital device (e.g., metering device 218a depicted in FIG. 2) can be connected at a primary distraction circuit or secondary utilization circuit.

At step 610, the NCSD can determine to analyze the sampled time series independently. The NCSD can determine to analyze the sampled time series of the signal independently from other sampled time series of other signals measured in the utility grid. The NCSD can analyze the sampled time series of the signal as a solitary process without taking into account dependency.

At step 615, the NCSD can select an estimator. The NCSD can select, responsive to determining to independently analyze the sampled time series, an estimator from a predetermined list of estimators configured for analyzing the sampled time series independently from other sampled time series of other signals measured in the utility grid. The estimators can be selected from a list such as illustrated in Table 2. For the solitary time series, the NCSD can select an estimator corresponding to estimators of types 1 through 4.

At step 620, the NCSD can determine a metric. The NCSD can determine a metric for the sampled time series of the signal based on the estimator configured for analyzing the sampled time series independently from other sampled time series of other signals measured in the utility grid. The NCSD can apply the estimator to the sampled time series of the signal to determine the metric (e.g., a value for the metric).

At step 625, the NCSD can compare the metric with a nominal metric for the estimator. The NCSD can use a qualifier corresponding to the selected type of estimator from Table 2 to determine the nominal metric. The NCSD can learn the nominal metric using machine learning, or unsupervised machine learning techniques. For example, the NCSD can use historical sampled time series to generate a model for values of the metric. The NCSD can establish bounds for the estimator (e.g., high and low bounds).

At step 630, the NCSD can detect a deviation. The NCSD can detect, responsive to the comparison, a deviation between the metric for the sampled time series of the signal and the nominal metric for the estimator. At step 635, the NCSD can generate an alert. Responsive to detecting the deviation, the NCSD can generate an alert that indicates the deviation and the digital device connected to the utility grid that provided the sampled time series of the signal that deviates from the nominal metric.

Figure 7:
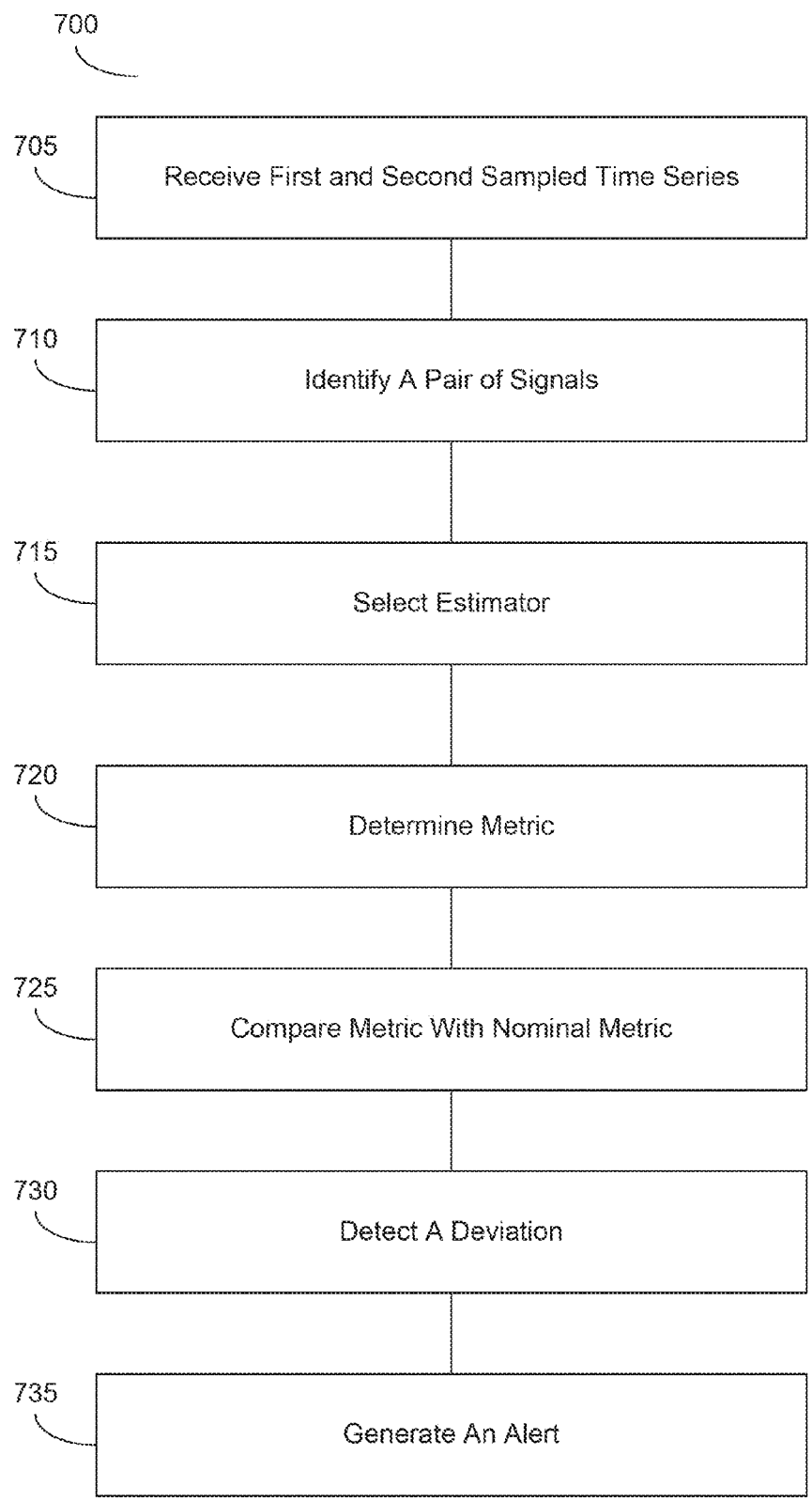
FIG. 7 is a flow chart depicting a method of detecting signal deviations in a utility grid in accordance with an embodiment.

Referring now to FIG. 7, a flow chart depicting a method of detecting signal deviations in a utility grid in accordance with an embodiment is shown. The method 700 can be performed by one or more component, module or element depicted in FIG. 1, 2, 5A or 5B. In brief overview, a non-conforming signal detector ("NCSD") can receive first and second sampled time series at step 705. At step 710, the NCSD can identify a pair of signals. At step 715, the NCSD can select an estimator. At step 720, the NCSD can determine a metric. At 725, the NCSD can compare the metric with a nominal metric. At 730, the NCSD can detect a deviation. At step 735, the NCSD can generate an alert.

Still referring to FIG. 7, and in further detail, the NCSD receive first and second sampled time series at step 705. The NCSD can receive a first sampled time series of a first signal of a first process or a first operational characteristic of electricity in the utility grid. The first sampled time series of the first signal can be measured by a first digital device connected to the utility grid. The NCSD can also receive a second sampled time series of a second signal of a second process or a second operational characteristic of electricity in the utility grid. The second sampled time series of the second signal can be measured by a second digital device connected to the utility grid.

At step 710, the NCSD can identify a pair of signals. The NCSD can identify a pair of signals formed from the first sampled time series of the first signal and the second sampled time series of the second signal responsive to identifying a physical co-dependence between the first signal and the second signal. A pair of signals can be two signals. The first and second signals can correspond to a same type of signal or different types of signals. For example, both the first and second signals can be voltage measurements at different location in the utility grid, or the first signal can be a current measurement and the second signal can be a voltage measurement. The first and second digital devices can be different devices, different types of devices, or located at different parts of the utility grid. In some cases, both the first and second digital devices can be in a same branch of the utility grid, such as a same branch in a secondary utilization circuit 216 as illustrated in FIG. 2.

At step 715, the NCSD can select an estimator. The NCSD can select, based on the pair of signals identified based on the physical co-dependence, an estimator from a predetermined list of estimators configured for the pair of signals. The estimator can be configured for application to a pair of signals (e.g., two signals). The NCSD can select the estimator from the predetermined list of estimators, such as illustrated in Table 2. The NCSD can select an estimator corresponding to estimator types 5-8, which are applicable for analyzing pairs of signals.

At step 720, the NCSD can determine a metric. The NCSD can determine, based on the estimator configured for the pair of signals identified based on the physical co-dependence, a metric for the pair of signals. The NCSD can determine the metric by applying the selected estimator to the sampled time series of the pair of signals to determine a value for the metric.

At 725, the NCSD can compare the metric with a nominal metric. The NCSD can compare the metric for the pair of signals with a nominal metric for the estimator configured for the pair of signals. The NCSD can use a qualifier corresponding to the selected type of estimator from Table 2 to determine the nominal metric. The NCSD can learn the nominal metric using machine learning, or unsupervised machine learning techniques. For example, the NCSD can use historical sampled time series of pairs of signals to generate a model for values of the metric. The NCSD can establish bounds for the estimator (e.g., high and low bounds).

At 730, the NCSD can detect a deviation. The NCSD can detect, responsive to the comparison, a deviation between the metric for the pair of signals and the nominal metric for the estimator. At step 735, the NCSD can generate an alert. Responsive to detecting the deviation, the NCSD can generate an alert that indicates the deviation and at least one of the first digital device or the second digital device connected to the utility grid that provided the at least one of the first sampled time series or the second sampled time series that form the pair of signals that deviate from the nominal metric.

Figure 8:
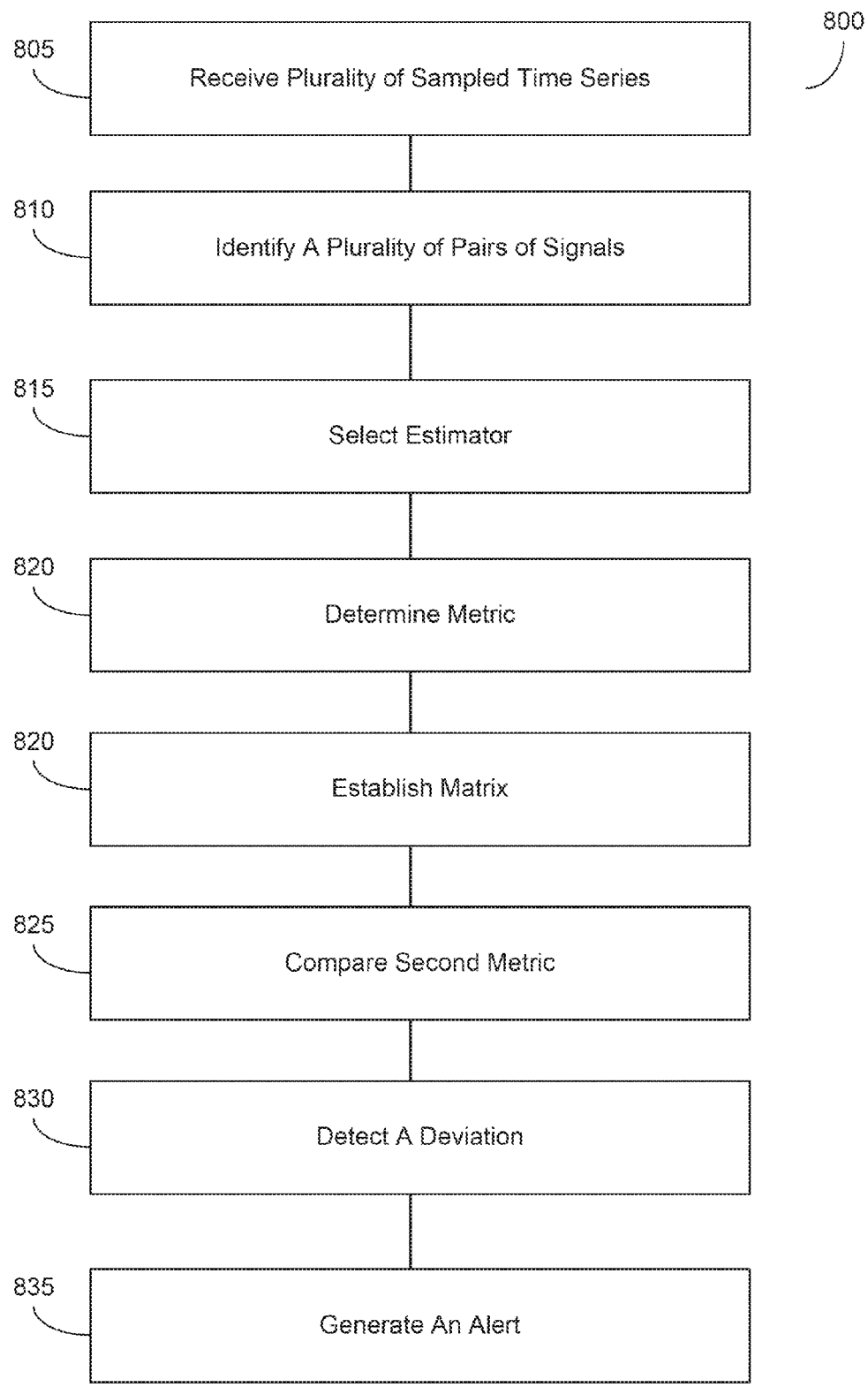
FIG. 8 is a flow chart depicting a method of detecting signal deviations in a utility grid in accordance with an embodiment.

Referring now to FIG. 8, a flow chart depicting a method of detecting signal deviations in a utility grid in accordance with an embodiment is shown. The method 800 can be performed by one or more component, module or element depicted in FIG. 1, 2, 5A or 5B. In brief overview, a non-conforming signal detector ("NCSD") can receive a plurality of sampled time series at step 805. At step 810, the NCSD can identify a plurality of pairs of signals. At step 815, the NCSD can select an estimator. At step 820, the NCSD can determine a metric. At step 820, the NCSD can establish a matrix. At step 825, the NCSD can compare a second metric. At step 830, the NCSD can detect a deviation. At step 835, the NCSD can generate an alert.

Still referring to FIG. 8, and in further detail, the NCSD can receive a plurality of sampled time series at step 805. The NCSD can receive a plurality of sampled time series of a group or ensemble of signals of processes or operational characteristics of electricity in the utility grid. The group of sampled time series of the group of signals can be measured by one or more digital devices connected to the utility grid. For example, the NCSD can receive a first sampled time series of a first signal from a first digital device; a second sampled time series of a second signal from a second digital device; a third sampled time series of a third signal from a third digital device; and a fourth sampled time series of a fourth signal from a fourth digital device. The sampled time series can have time stamps that match one another, or match within a threshold (e.g., 5 seconds, 10 seconds, 20 seconds, 30 seconds, 1 minute or more). The sampled time series can each be sampled at a same sampling rate.

At step 810, the NCSD can identify a plurality of pairs of signals. The NCSD can identify, responsive to determining a physical co-dependence, a plurality of pairs of signals from the plurality of sampled time series of the plurality of signals. For example, the NCSD can form a first pair for the first signal and the second signal; a second pair for the first signal and the third signal; and a third pair for the first signal and the fourth signal.

At step 815, the NCSD can select an estimator. The NCSD can select, responsive to the identified physical co-dependence, one or more estimators from a predetermined list of estimators configured for the identified physical co-dependence. The estimator can be configured for application to a pair of signals (e.g., two signals). The NCSD can select the estimator from the predetermined list of estimators, such as illustrated in Table 2. The NCSD can select an estimator corresponding to estimator types 5-8, which are applicable for analyzing pairs of signals. The NCSD can apply the selected estimator to analyze each pair of signals in the group of signals. In some cases, the NCSD can use one or more estimators to analyze each pair of signals in the group of signals.

At step 820, the NCSD can determine a metric. The NCSD can determine, based on the one or more estimators configured for the physical co-dependence, a metric for each of the plurality of pairs of signals. The NCSD can determine a value for the metric.

At step 820, the NCSD can establish a matrix. The NCSD can establish a matrix structure with the metric for each of the plurality of pairs of signals. The NCSD can establish an information transfer matrix. For example, the NCSD can establish a matrix data structure as illustrated in Table 1 for four signals.

At step 825, the NCSD can compare a second metric. The NCSD can compare a second metric of the matrix structure with a nominal matrix metric. For example, the NCSD can analyze the metrics populated in the matrix structure with a nominal matrix metric. The second metric can be an operation for a matrixes, such as orthogonality, correlation, dot product, linear transforms, etc.

At step 830, the NCSD can detect a deviation. The NCSD can detect, responsive to the comparison, a deviation between the second metric for the matrix structure and the nominal matrix metric. At step 835, the NCSD can generate an alert. Responsive to detecting the deviation, the NCSD can generate an alert that indicates the deviation and the one or more digital devices connected to the utility grid that provided the plurality of sampled time series of the plurality of signals that deviate from the nominal matrix metric.

At least one aspect is directed to a method of detecting signal deviations in a utility grid. The method can be performed by an NCSD. The NCSD can receive a sampled time series of a signal of a process or an operational characteristic of electricity in the utility grid. The sampled time series of the signal measured by a digital device connected to the utility grid. The NCSD can determine to analyze the sampled time series of the signal independently from other sampled time series of other signals measured in the utility grid. For example, the NCSD can default to analyzing this signal as a solitary process, or the NCSD can determine to analyze the signal as a solitary process if the NCSD does not receive other signals that exhibit dependency with the received signal. The NCSD can select, responsive to determining to independently analyze the sampled time series, an estimator from a predetermined list of estimators configured for analyzing the sampled time series independently from other sampled time series of other signals measured in the utility grid. The NCSD can determine a metric for the sampled time series of the signal based on the estimator configured for analyzing the sampled time series independently from other sampled time series of other signals measured in the utility grid. The NCSD can compare the metric for the sampled time series of the signal with a nominal metric for the estimator. The NCSD can detect, responsive to the comparison, a deviation between the metric for the sampled time series of the signal and the nominal metric for the estimator. The NCSD can generate, responsive to detecting the deviation, an alert that indicates the deviation and the digital device connected to the utility grid that provided the sampled time series of the signal that deviates from the nominal metric.

In some embodiments, the NCSD corrects sampling voids in the sampled time series of the signal prior to determining the metric for the sampled time series of the signal. The NCSD can determine whether to void the sampled time series of the signal based on a number of void samples. The NCSD can process, prior to determining the metric for the sampled time series of the signal, the sampled time series of the signal by performing at least one of: linear trend removal, removal of spectral components with periods greater than a sample record, or spectral filtering.

The NCSD can retrieve the nominal metric from memory. The NCSD can generate the nominal metric using historical sampled time series of the signal. The historical sampled time series can correspond to a predetermined time interval prior to receiving the sampled time series of the signal. The NCSD can identify, prior to detecting the deviation, the nominal metric using a learning process. The NCSD can identify, prior to detecting the deviation, the nominal metric using an unsupervised machine learning technique. The NCSD can identify, prior to detecting the deviation, the nominal metric using an unsupervised machine learning technique absent a priori results or training data. The NCSD can identify the nominal metric using historical sampled time series of the signal, wherein the historical sampled time series of the signal are uncorrupted.

The NCSD can select a second estimator from the predetermined list of estimators. The NCSD can determine a second metric for the sampled time series of the signal based on the second estimator. The NCSD can compare the second metric for the sampled time series of the signal with a second nominal metric for the second estimator. The NCSD can detect a deviation between the second metric for the sampled time series of the signal and the second nominal metric for the estimator. The NCSD can, responsive to detecting the deviation, generate a second alert that indicates the deviation and the digital device connected to the utility grid that provided the sampled time series of the signal that deviates from the nominal metric.

The NCSD can receive a second sampled time series of the signal of the process or the operational characteristic of electricity in the utility grid. The second sampled time series of the signal can be measured by the digital device connected to the utility grid subsequent to the sampled time series of the signal. The NCSD can detect a deviation between a second metric for the second sampled time series of the signal and the nominal metric for the estimator. The NCSD can generate a second alert based on the alert and the deviation between the second metric and the nominal metric. The NCSD can identify, based on the alert and the second alert, the deviation as caused by a forged signal.

The predetermined list of estimators comprises at least one of: a difference in a central moment, a variation in a location of correlation, a variation in a location of a power spectral peak, or an extent of samples deviating more than a threshold from the location. The metric can include one of a univariate central moment computed from the sampled time series of the signal, an autocorrelation sequence, or a power spectra.

The predetermined list of estimators can include at least one of: a classical naïve estimator, a near neighbor, a Bayesian inference on densities, a Kernel density estimation, or a risk function for parametric densities. The metric can include one of: a non-parametric density computed from the sampled time series of the signal, a parametric density, a rate of device operational state changes, or an alpha-stable density for a heavy tail.

The predetermined list of estimators can include at least one of: signal entropy, sample entropy, multi-scale expansion of sample entropy, Renyi entropy, Kolmogorov complexity, or Gibbs Measure. The metric can include one of classical entropy based on a likelihood determined from possible states.

The predetermined list of estimators can include a time series ordinal pattern. The metric can include an empirical permutation entropy.

The NCSD can provide a command to the device responsive to detecting the deviation. The NCSD can disable the device responsive to detecting the deviation, reset the device responsive to detecting the deviation, or update the device responsive to detecting the deviation. The NCSD can prevent, responsive to detecting the deviation, the sampled time series of the signal measured by the digital device from being used to adjust a tap setting at a voltage regulator of the utility grid.

At least one aspect is directed to a method of detecting signal deviations in a utility grid. An NCSD can receive a first sampled time series of a first signal of a first process or a first operational characteristic of electricity in the utility grid. The first sampled time series of the first signal can be measured by a first digital device connected to the utility grid. The NCSD can receive a second sampled time series of a second signal of a second process or a second operational characteristic of electricity in the utility grid. The second sampled time series of the second signal can be measured by a second digital device connected to the utility grid. The NCSD can identify a pair of signals formed from the first sampled time series of the first signal and the second sampled time series of the second signal responsive to identifying a physical co-dependence between the first signal and the second signal. The NCSD can select, based on the pair of signals identified based on the physical co-dependence, an estimator from a predetermined list of estimators configured for the pair of signals. The NCSD can determine, based on the estimator configured for the pair of signals identified based on the physical co-dependence, a metric for the pair of signals. The NCSD can compare the metric for the pair of signals with a nominal metric for the estimator configured for the pair of signals. The NCSD can detect, responsive to the comparison, a deviation between the metric for the pair of signals and the nominal metric for the estimator. The NCSD can, responsive to detecting the deviation, generate an alert that indicates the deviation and at least one of the first digital device or the second digital device connected to the utility grid that provided the at least one of the first sampled time series or the second sampled time series that form the pair of signals that deviate from the nominal metric.

In some embodiments, the NCSD can correct, prior to determining the metric for the pair of signals, sampling voids in at least one of the first sampled time series of the first signal or the second sampled time series of the second signal. The NCSD can determine, based on a number of void samples, whether to void at least one of the first sampled time series of the first signal or the second sampled time series of the second signal. The NCSD can process, prior to determining the metric for the pair of signals, at least one of the first sampled time series of the first signal or the second sampled time series of the second signal by performing at least one of: linear trend removal, removal of spectral components with periods greater than a sample record, or spectral filtering.

The NCSD can determine the physical co-dependence between the first signal and the second signal based on an expected dependence as indicated by one or more physical factors. The one or more physical factors can include connectivity between the first digital device and the second digital device. The one or more physical factors can include a connection topology of an electric circuit of the utility grid. The NCSD can determining the physical co-dependence between the first signal and the second signal based on the first digital device and the second digital device positioned on a same branch of a distribution circuit of the utility grid. The NCSD can determine the physical co-dependence between the first signal and the second signal based on the first digital device positioned ahead of a branch point on a distribution circuit of the utility grid, and the second digital device positioned after the branch point. The NCSD can determine the physical co-dependence between the first signal and the second signal based on a common phase between the first signal and the second signal.

The estimator can be based on at least one of a statistical cross-moment, a joint density approximation, a dependency quantification by entropic divergence measures, or a causality quantification and prediction by directed dependence measures. The predetermined list of estimators can include at least one of a covariance or cumulants. The metric can include one of a correlation or an orthogonality. The predetermined list of estimators can include at least one of conditional probability, Mahalanobis distance, or Minkowski distance. The metric can include a statistical distance.

The predetermined list of estimators can include at least one of Kullback-Leibler divergence, conditional entropy, or maximum entropy principle. The metric can include mutual information. The predetermined list of estimators comprises at least one of transfer entropy, Granger causality, or Jeffrey-Kullback-Leibler Divergence, and the metric can include causality.

The NCSD can retrieve the nominal metric from memory. The NCSD can generate the nominal metric using historical first sampled time series of the first signal and historical second sampled time series of the second signal. The historical first sampled time series can correspond to a predetermined time interval prior to receiving the first sampled time series of the first signal. The historical second sampled time series can correspond to the predetermined time interval prior to receiving the second sampled time series of the second signal.

The NCSD can identify, prior to detecting the deviation, the nominal metric using a learning process. The NCSD can identify, prior to detecting the deviation, the nominal metric using an unsupervised machine learning technique. The NCSD can identify, prior to detecting the deviation, the nominal metric using an unsupervised machine learning technique absent a priori results or training data.

The NCSD can identify the nominal metric using (i) first historical sampled time series of the first signal, wherein the first historical sampled time series of the first signal are uncorrupted, and (ii) a second historical sampled time series of the second signal, wherein the second historical sampled time series of the second signal are uncorrupted.

The NCSD can select a second estimator from the predetermined list of estimators. The NCSD can determine a second metric for the pair of signals based on the second estimator. The NCSD can compare the second metric for the pair of signals with a second nominal metric for the second estimator. The NCSD can detect a deviation between the second metric for the pair of signals and the second nominal metric for the second estimator. The NCSD can, responsive to detecting the deviation, generate a second alert that indicates the deviation and at least one of the first digital device or the second digital device.

The NCSD can receive a second sampled time series of the signal of the process or the operational characteristic of electricity in the utility grid. The second sampled time series of the signal can be measured by the digital device connected to the utility grid subsequent to the sampled time series of the signal. The NCSD can detect a deviation between a second metric for the second sampled time series of the signal and the nominal metric for the estimator. The NCSD can generate a second alert based on the alert and the deviation between the second metric and the nominal metric. The NCSD can identify, based on the alert and the second alert, the deviation as caused by a forged signal.

The first digital device and the second digital device can be a same digital device.

The NCSD can provide a command to at least one of the first digital device or the second digital device responsive to detecting the deviation. The NCSD can disable at least one of the first digital device or the second digital device responsive to detecting the deviation, reset at least one of the first digital device or the second digital device responsive to detecting the deviation, or update at least one of the first digital device or the second digital device responsive to detecting the deviation.

The NCSD can prevent, responsive to detecting the deviation, the sampled time series of the signal measured by at least one of the first digital device or the second digital device from being used to adjust a tap setting at a voltage regulator of the utility grid.

At least one aspect is directed to a method of detecting signal deviations in a utility grid. The NCSD can receiving a plurality of sampled time series of a plurality of signals of a plurality of processes or operational characteristics of electricity in the utility grid. The plurality of sampled time series of the plurality of signals measured by one or more digital devices connected to the utility grid. The NCSD can identify, responsive to determining a physical co-dependence, a plurality of pairs of signals from the plurality of sampled time series of the plurality of signals. the NCSD can select, responsive to the identified physical co-dependence, one or more estimators from a predetermined list of estimators configured for the identified physical co-dependence. The NCSD can determine, based on the one or more estimators configured for the physical co-dependence, a metric for each of the plurality of pairs of signals. The NCSD can establishing a matrix structure with the metric for each of the plurality of pairs of signals. The NCSD can compare a second metric of the matrix structure with a nominal matrix metric. The NCSD can detect, responsive to the comparison, a deviation between the second metric for the matrix structure and the nominal matrix metric. The NCSD can, responsive to detecting the deviation, generate an alert that indicates the deviation and the one or more digital devices connected to the utility grid that provided the plurality of sampled time series of the plurality of signals that deviate from the nominal matrix metric.

In some embodiments, the NCSD can correct, prior to determining the metric for each of the plurality of pairs of signals, sampling voids in at least one of the plurality of sampled time series. The NCSD can determine, based on a number of void samples, whether to void at least one of the plurality of pairs of signals. The NCSD can process, prior to determining the metric for the plurality of pair of signals, at least one of the plurality of sampled time series: linear trend removal, removal of spectral components with periods greater than a sample record, or spectral filtering.

The NCSD can determine the physical co-dependence between a first pair of signals of the plurality of pairs of signals based on an expected dependence as indicated by one or more physical factors. The one or more physical factors can include connectivity between the first digital device and the second digital device. The one or more physical factors can include a connection topology of an electric circuit of the utility grid.

The NCSD can determine the physical co-dependence between a first pair of signals of the plurality of pairs of signals based on the one or more digital devices positioned on a same branch of a distribution circuit of the utility grid. The NCSD can determine the physical co-dependence between a first pair of signals of the plurality of pairs of signals based on a first digital device of the one or more digital devices positioned ahead of a branch point on a distribution circuit of the utility grid, and a second digital device of the one or more digital devices positioned after the branch point. The NCSD can determine the physical co-dependence between a first pair of signals of the plurality of pairs of signals based on a common phase between a first signal of the first pair and a second signal of the first pair.

The one or more estimators can be based on at least one of a statistical cross-moment, a joint density approximation, a dependency quantification by entropic divergence measures, or a causality quantification and prediction by directed dependence measures. The predetermined list of estimators comprises at least one of a covariance or cumulants, and the metric can include one of a correlation or an orthogonality. The predetermined list of estimators comprises at least one of conditional probability, Mahalanobis distance, or Minkowski distance, and the metric can include a statistical distance. The predetermined list of estimators comprises at least one of Kullback-Leibler divergence, conditional entropy, or maximum entropy principle, and the metric can include mutual information. The predetermined list of estimators comprises at least one of transfer entropy, Granger causality, or Jeffrey-Kullback-Leibler Divergence, and the metric can include causality.

The NCSD can retrieve the nominal matrix metric from memory. The NCSD can generate the nominal matrix metric using historical sampled time series. The historical sampled time series can correspond to a predetermined time interval prior to receiving the plurality of sampled time series of the plurality of signals. The NCSD can identify, prior to detecting the deviation, the nominal matrix metric using a learning process. The NCSD can identify, prior to detecting the deviation, the nominal matrix metric using an unsupervised machine learning technique. The NCSD can identify, prior to detecting the deviation, the nominal matrix metric using an unsupervised machine learning technique absent a priori results or training data.

The NCSD can identify the nominal metric using (i) a first historical sampled time series of a first signal of the plurality of, wherein the first historical sampled time series of the first signal are uncorrupted, and (ii) a second historical sampled time series of a second signal paired with the first signal, wherein the second historical sampled time series of the second signal are uncorrupted.

The NCSD can select a second estimator from the predetermined list of estimators. The NCSD can determine a third metric for each of the plurality of pairs of signals based on the second estimator. The NCSD can establish a second matrix structure with the third metric for each of the plurality of pairs of signals. The NCSD can compare a fourth metric of the second matrix structure with a second nominal matrix metric. The NCSD can detect a deviation between the fourth metric for the matrix structure and the second nominal matrix metric for the second estimator. The NCSD can, responsive to detecting the deviation, generate a second alert that indicates the deviation and at least one of the one or more digital devices.

The NCSD can receive a second plurality of sampled time series of the plurality of signals. The second plurality of sampled time series can be measured by the one or more digital devices connected to the utility grid subsequent to the plurality of sampled time series. The NCSD can detect a deviation between a third metric of a second matrix structure established for the plurality of pairs of signals using the second plurality of sampled time series. The NCSD can generate a second alert based on the alert and the deviation between the third metric and the nominal matrix metric. The NCSD can identify, based on the alert and the second alert, the deviation as caused by a forged signal.

The NCSD can provide a command to at least one of the one or more digital devices responsive to detecting the deviation. The NCSD can disable at least one of the one or more digital devices responsive to detecting the deviation, reset at least one of the one or more digital devices responsive to detecting the deviation, or update at least one of the one or more digital devices responsive to detecting the deviation.

The NCSD can prevent, responsive to detecting the deviation, at least one of the plurality of sampled time series measured by the one or more digital devices from being used to adjust a tap setting at a voltage regulator of the utility grid.

While this specification contains many specific implementation details, these should not be construed as limitations on the scope of any subject matter or of what may be claimed, but rather as descriptions of features specific to particular embodiments. Certain features described in this specification in the context of separate embodiments can also be implemented in combination in a single embodiment. Conversely, various features described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Particular embodiments of the subject matter have been described. Other embodiments are within the scope of the following claims. While operations are depicted in the drawings in a particular order, this should not be understood as requiring that such operations be performed in the particular order shown or in sequential order, or that all illustrated operations are required to be performed. Actions described herein can be performed in a different order. In addition, the processes depicted in the accompanying figures do not necessarily require the particular order shown, or sequential order, to achieve desirable results. In certain embodiments, multitasking and parallel processing may be advantageous.

The separation of various system components does not require separation in all embodiments, and the described program components can be included in a single hardware or software product. For example, the Process Selection component 115 and the metric estimator component 120 can be a single module, a logic device having one or more processing circuits, or part of an online content item placement system.

Having now described some illustrative embodiments, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed in connection with one embodiment are not intended to be excluded from a similar role in other embodiments.

The phraseology and terminology used herein is for the purpose of description and should not be regarded as limiting. The use of "including," "comprising," "having," "containing," "involving," "characterized by," "characterized in that," and variations thereof herein, is meant to encompass the items listed thereafter, equivalents thereof, and additional items, as well as alternate embodiments consisting of the items listed thereafter exclusively. In one embodiment, the systems and methods described herein consist of one, each combination of more than one, or all of the described elements, acts, or components.

Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements to single or plural configurations. References to any act or element being based on any information, act or element may include embodiments where the act or element is based at least in part on any information, act, or element.

Any embodiment disclosed herein may be combined with any other embodiment or embodiment, and references to "an embodiment," "some embodiments," "an alternate embodiment," "various embodiment," "one embodiment" or the like are not necessarily mutually exclusive and are intended to indicate that a particular feature, structure, or characteristic described in connection with the embodiment may be included in at least one embodiment or embodiment. Such terms as used herein are not necessarily all referring to the same embodiment. Any embodiment may be combined with any other embodiment, inclusively or exclusively, in any manner consistent with the aspects and embodiments disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

The systems and methods described herein may be embodied in other specific forms without departing from the characteristics thereof. The foregoing embodiments are illustrative rather than limiting of the described systems and methods. Scope of the systems and methods described herein is thus indicated by the appended claims, rather than the foregoing description, and changes that come within the meaning and range of equivalency of the claims are embraced therein.

What is claimed is:

1. A method of detecting signal deviations in a utility grid, comprising:
   receiving a first sampled time series of a first signal of a first process or a first operational characteristic of electricity in the utility grid, the first sampled time series of the first signal measured by a first digital device connected to the utility grid;
   receiving a second sampled time series of a second signal of a second process or a second operational characteristic of electricity in the utility grid, the second sampled time series of the second signal measured by a second digital device connected to the utility grid;
   identifying a pair of signals formed from the first sampled time series of the first signal and the second sampled time series of the second signal responsive to identifying a physical co-dependence between the first signal and the second signal, the physical co-dependence between the first signal and the second signal identified based on at least one of a dependence as indicated by one or more physical factors between the first digital device and the second digital device or a common phase between the first signal and the second signal, wherein the one or more physical factors includes at least one of connectivity between the first digital device and the second digital device or a connection topology of an electric circuit of the utility grid;
   selecting, based on the pair of signals identified based on the physical co-dependence, an estimator from a predetermined list of estimators configured for the pair of signals;
   determining, based on the estimator configured for the pair of signals identified based on the physical co-dependence, a metric for the pair of signals;
   comparing the metric for the pair of signals with a nominal metric for the estimator configured for the pair of signals;
   detecting, responsive to the comparison, a deviation between the metric for the pair of signals and the nominal metric for the estimator, the detected deviation due to at least one corrupt signal; and
   responsive to detecting the deviation, generating an alert that indicates the deviation and at least one of the first digital device or the second digital device connected to the utility grid that provided the at least one of the first sampled time series or the second sampled time series that form the pair of signals that deviate from the nominal metric due to the at least one corrupt signal.

2. The method of claim 1, comprising:
   correcting, prior to determining the metric for the pair of signals, sampling voids in at least one of the first sampled time series of the first signal or the second sampled time series of the second signal.

3. The method of claim 1, comprising:
   determining, based on a number of void samples, whether to void at least one of the first sampled time series of the first signal or the second sampled time series of the second signal.

4. The method of claim 1, comprising:
   processing, prior to determining the metric for the pair of signals, at least one of the first sampled time series of the first signal or the second sampled time series of the second signal by performing at least one of: linear trend removal, removal of spectral components with periods greater than a sample record, or spectral filtering.

5. The method of claim 1, comprising:
   determining the physical co-dependence between the first signal and the second signal based on the first digital device and the second digital device positioned on a same branch of a distribution circuit of the utility grid.

6. The method of claim 1, comprising:
   determining the physical co-dependence between the first signal and the second signal based on the first digital device positioned ahead of a branch point on a distribution circuit of the utility grid, and the second digital device positioned after the branch point.

7. The method of claim 1, wherein the estimator is based on at least one of a statistical cross-moment, a joint density approximation, a dependency quantification by entropic divergence measures, or a causality quantification and prediction by directed dependence measures.

8. The method of claim 1, comprising:
identifying, prior to detecting the deviation, the nominal metric using a learning process.

9. The method of claim 1, comprising:
providing a command to at least one of the first digital device or the second digital device responsive to detecting the deviation.

10. The method of claim 1, comprising at least one of:
disabling at least one of the first digital device or the second digital device responsive to detecting the deviation;
resetting at least one of the first digital device or the second digital device responsive to detecting the deviation; or
updating at least one of the first digital device or the second digital device responsive to detecting the deviation.

11. The method of claim 1, comprising:
preventing, responsive to detecting the deviation, a sampled time series of a signal measured by at least one of the first digital device or the second digital device from being used to adjust a tap setting at a voltage regulator of the utility grid.

12. A system for detection of signal deviations in a utility grid, comprising:
a non-conforming signal detector comprising one or more processors that execute a metric estimator component to:
receive a first sampled time series of a first signal of a first process or a first operational characteristic of electricity in the utility grid, the first sampled time series of the first signal measured by a first digital device connected to the utility grid;
receive a second sampled time series of a second signal of a second process or a second operational characteristic of electricity in the utility grid, the second sampled time series of the second signal measured by a second digital device connected to the utility grid;
identify a pair of signals formed from the first sampled time series of the first signal and the second sampled time series of the second signal responsive to identifying a physical co-dependence between the first signal and the second signal, the physical co-dependence between the first signal and the second signal identified based on at least one of a dependence as indicated by one or more physical factors between the first digital device and the second digital device or a common phase between the first signal and the second signal, wherein the one or more physical factors includes at least one of connectivity between the first digital device and the second digital device or a connection topology of an electric circuit of the utility grid;
select, based on the pair of signals identified based on the physical co-dependence, an estimator from a predetermined list of estimators configured for the pair of signals;
determine, based on the estimator configured for the pair of signals identified based on the physical co-dependence, a metric for the pair of signals;
compare the metric for the pair of signals with a nominal metric for the estimator configured for the pair of signals;
detect, responsive to the comparison, a deviation between the metric for the pair of signals and the nominal metric for the estimator, the detected deviation due to at least one corrupt signal; and
responsive to detection of the deviation, generate an alert that indicates the deviation and at least one of the first digital device or the second digital device connected to the utility grid that provided the at least one of the first sampled time series or the second sampled time series that form the pair of signals that deviate from the nominal metric due to the at least one corrupt signal.

13. The system of claim 12, wherein the non-conforming signal detector is further configured to:
correct, prior to determination of the metric for the pair of signals, sampling voids in at least one of the first sampled time series of the first signal or the second sampled time series of the second signal.

14. The system of claim 12, wherein the non-conforming signal detector is further configured to:
determine, based on a number of void samples, whether to void at least one of the first sampled time series of the first signal or the second sampled time series of the second signal.

15. The system of claim 12, wherein the non-conforming signal detector is further configured to:
process, prior to determining the metric for the pair of signals, at least one of the first sampled time series of the first signal or the second sampled time series of the second signal by performing at least one of: linear trend removal, removal of spectral components with periods greater than a sample record, or spectral filtering.

16. The system of claim 12, wherein the non-conforming signal detector is further configured to:
determine the physical co-dependence between the first signal and the second signal based on the first digital device and the second digital device positioned on a same branch of a distribution circuit of the utility grid.

17. The system of claim 12, wherein the non-conforming signal detector is further configured to:
determine the physical co-dependence between the first signal and the second signal based on the first digital device positioned ahead of a branch point on a distribution circuit of the utility grid, and the second digital device positioned after the branch point.

18. The system of claim 12, wherein the estimator is based on at least one of a statistical cross-moment, a joint density approximation, a dependency quantification by entropic divergence measures, or a causality quantification and prediction by directed dependence measures.

19. The system of claim 12, wherein the non-conforming signal detector is further configured to:
identify, prior to detection of the deviation, the nominal metric using a learning process.

20. The system of claim 12, wherein the non-conforming signal detector is further configured to:
provide a command to at least one of the first digital device or the second digital device responsive to detecting the deviation.

21. The system of claim 12, wherein the non-conforming signal detector is further configured to at least one:
disable at least one of the first digital device or the second digital device responsive to detecting the deviation;
reset at least one of the first digital device or the second digital device responsive to detecting the deviation; or update at least one of the first digital device or the second digital device responsive to detecting the deviation.

22. The system of claim 12, wherein the non-conforming signal detector is further configured to:
prevent, responsive to detecting the deviation, a sampled time series of a signal measured by at least one of the first digital device or the second digital device from being used to adjust a tap setting at a voltage regulator of the utility grid.

* * * * *